(12) United States Patent
Barbato

(10) Patent No.: US 10,521,290 B2
(45) Date of Patent: Dec. 31, 2019

(54) SOLID STATE DRIVE WITH IMPROVED LLR TABLES

(71) Applicant: Sabrina Barbato, Turate (IT)

(72) Inventor: Sabrina Barbato, Turate (IT)

(73) Assignee: Memterex SRL, Saronno (IT)

( * ) Notice: Subject to any disclaimer, the term of this patent is extended or adjusted under 35 U.S.C. 154(b) by 0 days.

(21) Appl. No.: 16/000,093

(22) Filed: Jun. 5, 2018

(65) Prior Publication Data

US 2019/0370111 A1 Dec. 5, 2019

(51) Int. Cl.
| | |
|---|---|
| *G06F 11/10* | (2006.01) |
| *G06F 3/06* | (2006.01) |
| *G11C 11/56* | (2006.01) |
| *G11C 29/52* | (2006.01) |
| *G11C 16/04* | (2006.01) |

(52) U.S. Cl.
CPC ........ *G06F 11/1024* (2013.01); *G06F 3/0679* (2013.01); *G11C 11/5642* (2013.01); *G11C 16/0408* (2013.01); *G11C 29/52* (2013.01)

(58) Field of Classification Search
CPC .............. G06F 11/1024; G06F 3/0679; G11C 16/0408; G11C 29/52; G11C 11/5642
See application file for complete search history.

(56) References Cited

U.S. PATENT DOCUMENTS

| | | | |
|---|---|---|---|
| 2014/0281762 A1* | 9/2014 | Norrie .................. | G06F 11/2215 714/703 |
| 2015/0242268 A1* | 8/2015 | Wu ...................... | G06F 11/1012 714/773 |
| 2017/0269994 A1* | 9/2017 | Maffeis ............... | G11C 11/5642 |
| 2018/0076832 A1* | 3/2018 | Haga .................... | H03M 13/458 |
| 2018/0225041 A1* | 8/2018 | Chen .................... | G06F 11/1012 |
| 2019/0130967 A1* | 5/2019 | Danjean .............. | G11C 11/5642 |
| 2019/0220348 A1* | 7/2019 | Kokubun ............ | G06F 11/1048 |

OTHER PUBLICATIONS

A. Ismail and M. Sandell, "A Novel Dynamic Detection for Flash Memory," in IEEE Transactions on Circuits and Systems II: Express Briefs. 2019 (Year: 2019).*
M. Zhang et al., "RBER Aware Multi-Sensing for Improving Read Performance of 3D MLC NAND Flash Memory," in IEEE Access, vol. 6, pp. 61934-61947, 2018. (Year: 2018).*

* cited by examiner

*Primary Examiner* — Cynthia Britt
(74) *Attorney, Agent, or Firm* — Janeway Patent Law, PLLC; John M. Janeway

(57) ABSTRACT

A solid state comprising:
   memory cells programmable with threshold voltages, each one associated with a respective bit pattern and variable over the memory cells thereby defining a respective threshold voltage distribution. Each pair of adjacent bit patterns can be discriminated by a respective first reference voltage between the threshold voltages associated with the pair of adjacent bit patterns, and
   a controller for storing LLR tables; for each bit pattern combination comprising first, second and third bit patterns respectively associated with the first reference voltage, a second reference voltage higher than the first reference voltage, and a third reference voltage lower than the first reference voltage, each LLR table has an error information when that bit pattern combination is associated with respective threshold voltages that, based on the threshold voltage distributions, are inconsistent with each other, or a LLR value otherwise.

29 Claims, 9 Drawing Sheets

SOLID STATE DRIVE WITH IMPROVED LLR TABLES

BACKGROUND OF THE INVENTION

Field of the Invention

Figure 1A:
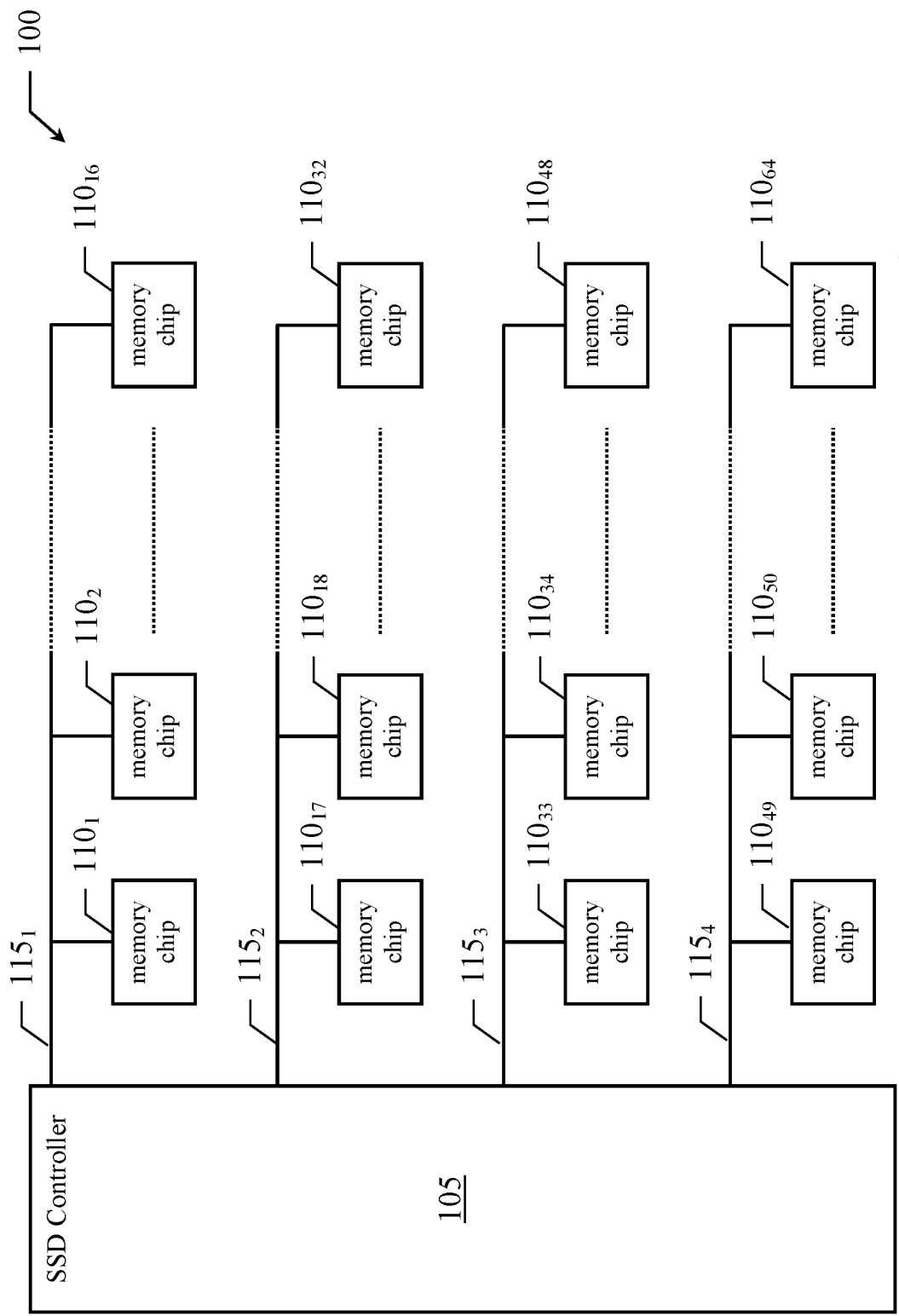

The present invention generally relates to solid state storage devices, also known as "Solid State Drives" (hereinafter, SSD devices), such as SSD devices provided with non-volatile memory chips (e.g., NAND flash memory chips) for storing data. More particularly, the present invention relates to SSD devices provided with error correction capabilities. Even more particularly, the present invention relates to SSD devices (or controllers thereof) with improved LLR tables, and to methods implemented by such SSD devices for decoding bits based on the improved LLR tables.

Overview of the Related Art

SSD devices are nowadays widely used, for example as storage units of computers in replacement of HDD ("Hard Disk Drives").

A common SSD device comprises non-volatile memory chips (for example, NAND flash memory chips) each one including non-volatile memory cells for storing data (bits) even in the absence of external power supply, and a SSD device controller (hereinafter, SSD controller) for managing SSD device operations, such as write/program, erase and read operations.

A common type of memory cell comprises a floating gate transistor: each bit or group of bits (identifying a respective logical state of the memory cell) is physically stored in each memory cell in the form of electric charge in the floating gate, which defines a corresponding threshold voltage of the transistor. The number of bits each memory cell is capable of storing depends on memory cell technology. For example, in "Single-Level Cell" (SLC) technology each memory cell (or SLC memory cell) is capable of storing one symbol (or bit pattern) comprising one bit (i.e. two logical states, 0 or 1, defining two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining eight threshold voltages).

While, ideally, all memory cells in a memory chip should feature same (nominal) threshold voltages for same logical states (or, equivalently, for same symbols or bit patterns), practically each threshold voltage associated with a corresponding logical state (or, equivalently, with a corresponding symbol or bit pattern) differs across the memory cells and defines a respective threshold voltage distribution (typically, a Gaussian-type probability distribution), thus resulting in a number of threshold voltage distributions equal to the possible logical states each memory cell can take.

Ideally, the threshold voltage distributions are spaced apart from one another, and a corresponding reference voltage is set between each pair of adjacent threshold voltage distributions for sensing/reading the logical state of the memory cells. This is schematically shown FIG. 4A for a SLC memory cell, in the top drawing of FIG. 2B for a 2-bit MLC memory cell (hereinafter referred to as MLC memory cell for the sake of conciseness) and in the top drawing of FIG. 2C for a TCL memory cell. In such figures the threshold voltage distributions are denoted by $D_j$ (j ranging from 1 to 2 for the SLC memory cell, from 1 to 4 for the MLC memory cell, and from 1 to 8 for the TLC memory cell).

Figure 2A:
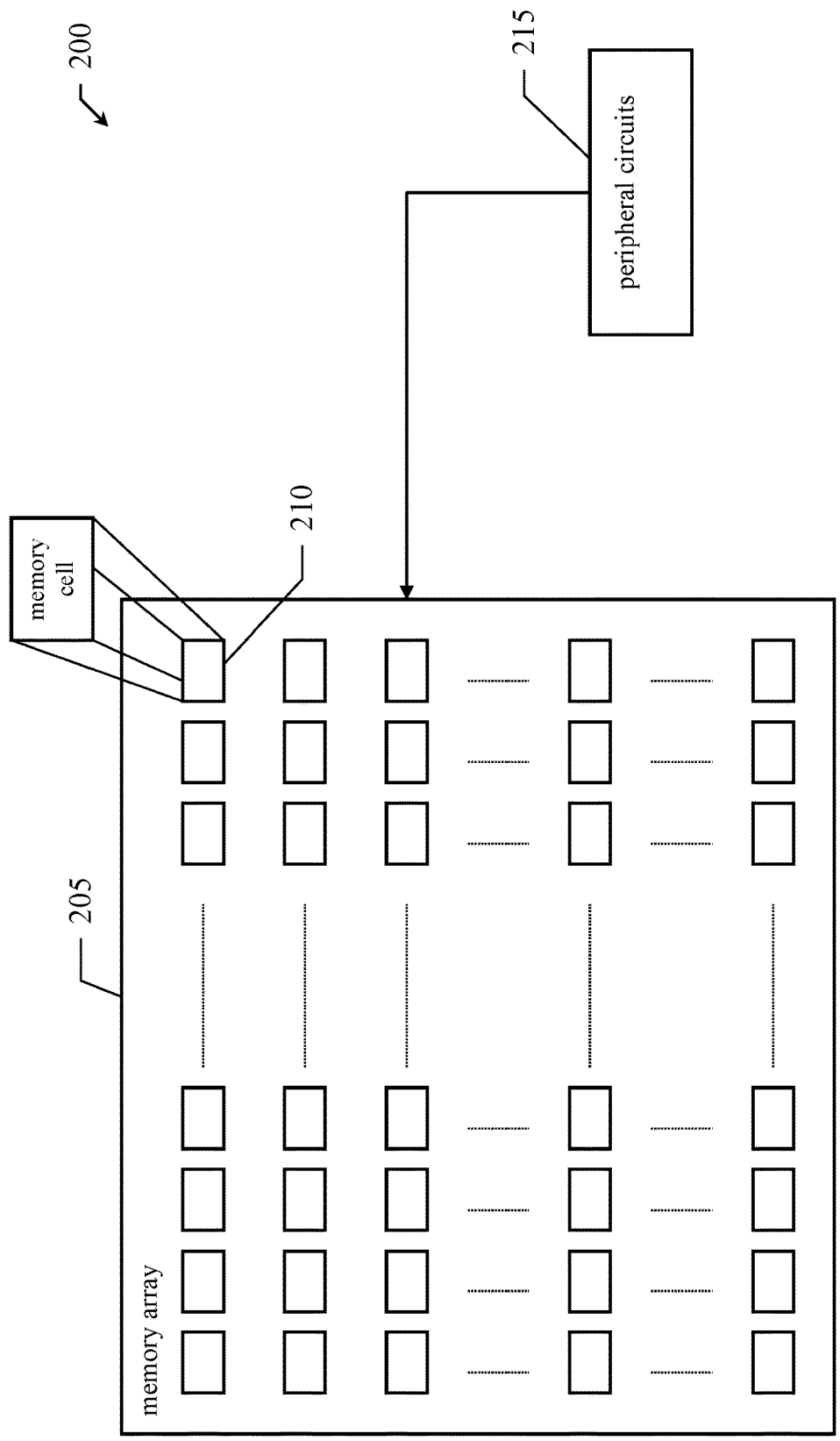
Figure 2B:
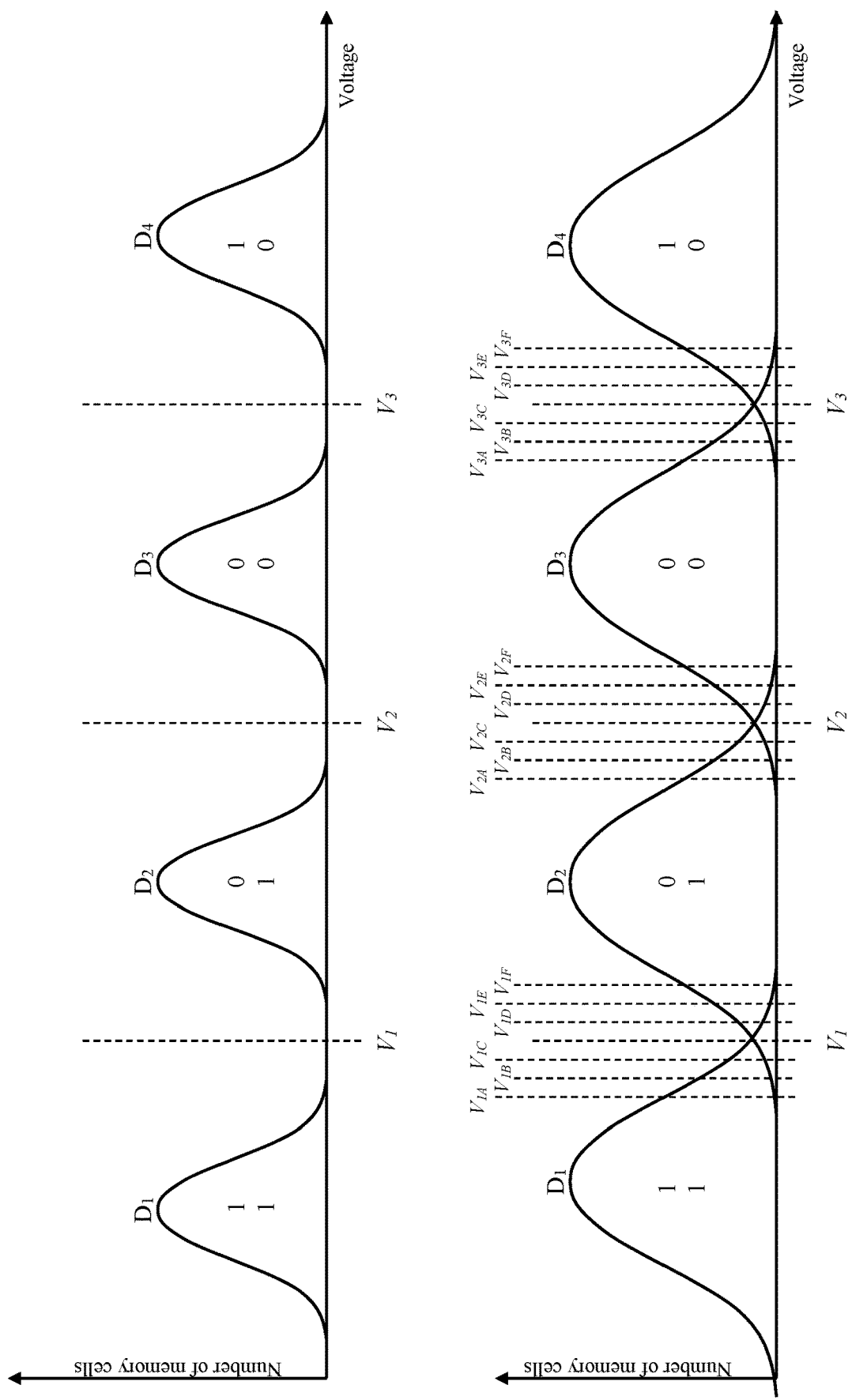
Figure 2C:
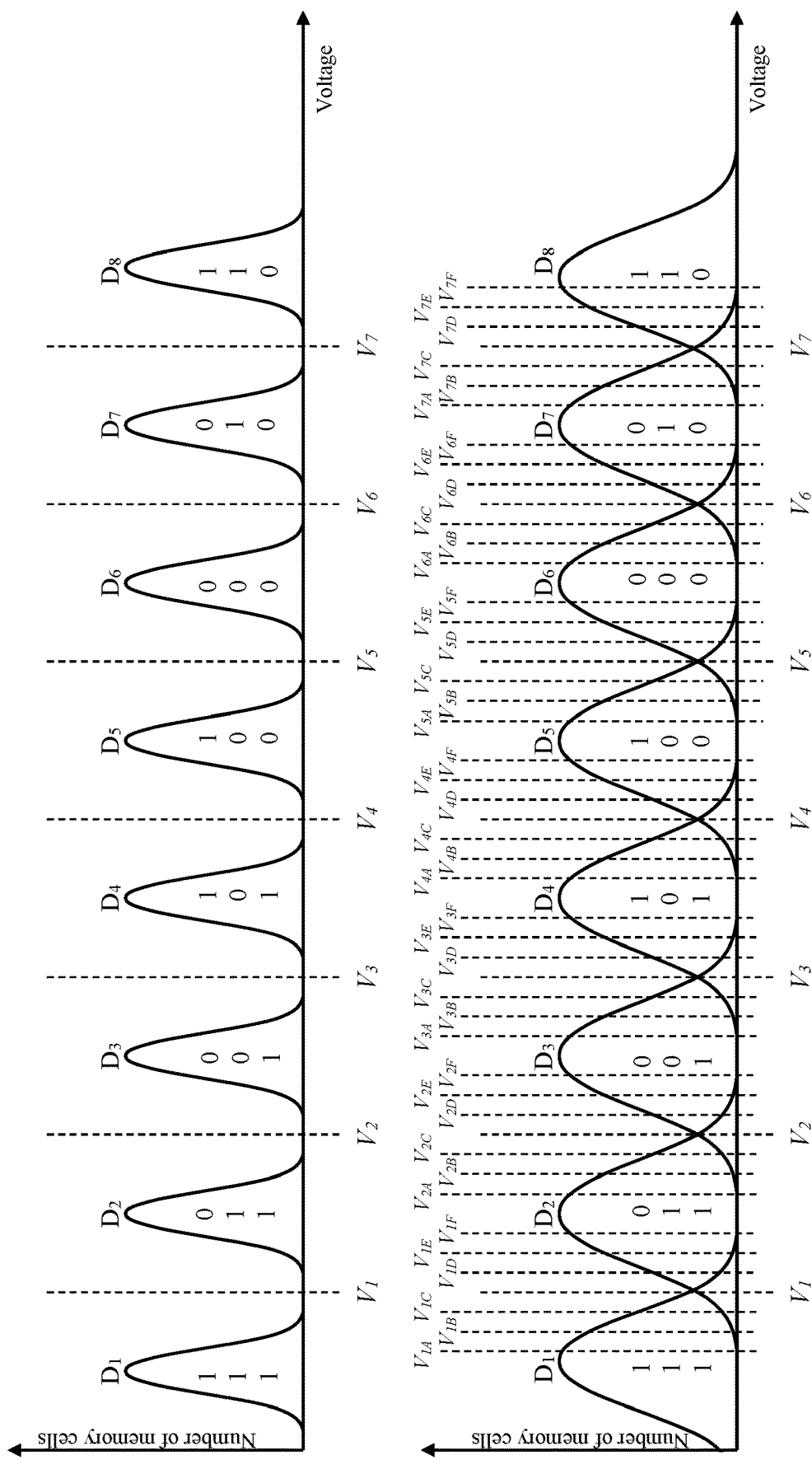
Figure 4A:
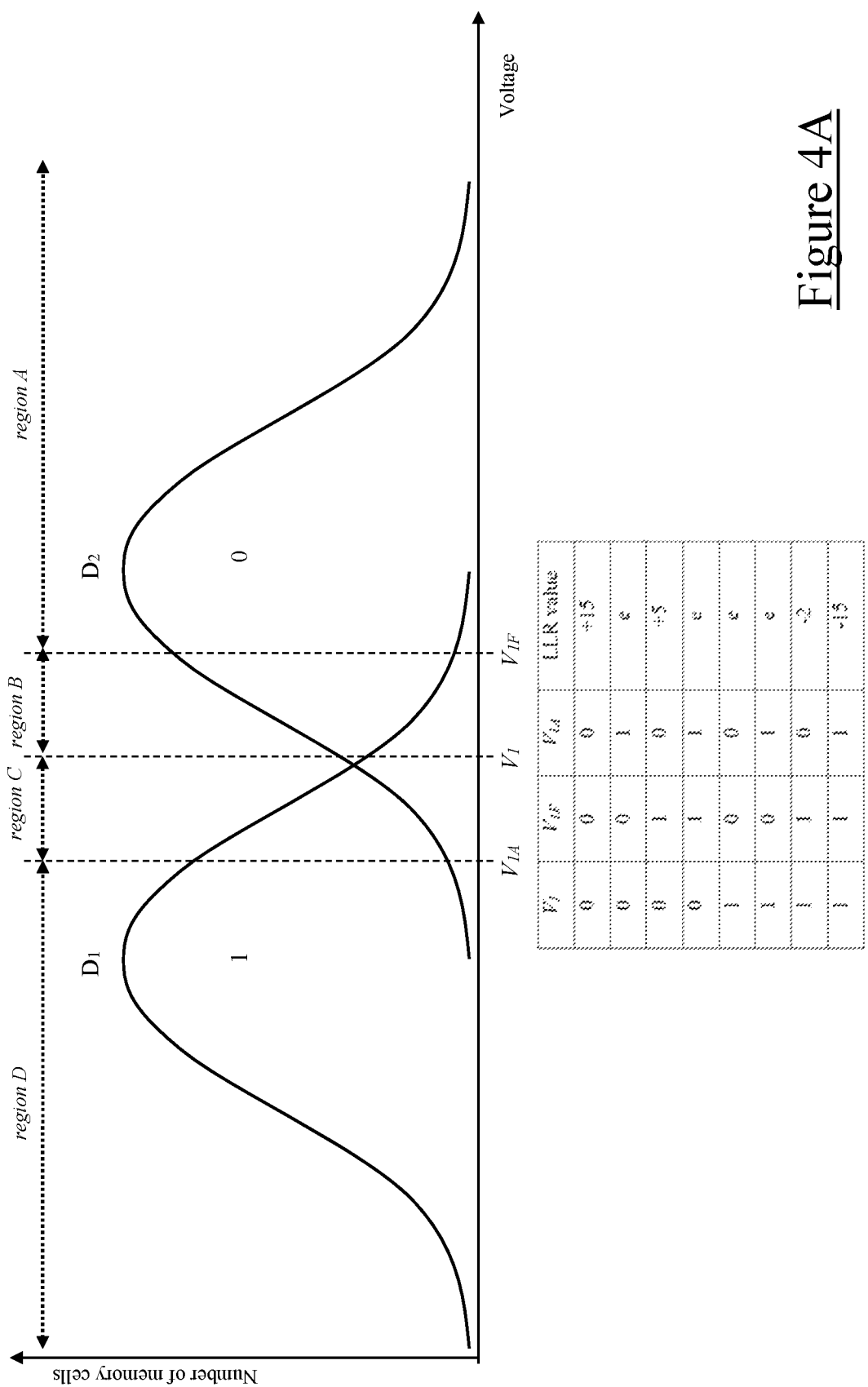

The threshold voltage distributions $D_j$ are (ideally) spaced apart from one another, and a corresponding reference voltage $V_k$ (usually referred to as hard reference voltage) is set between each pair of adjacent threshold voltage distributions $D_j$ for sensing/reading the logical state of the memory cells (k=1 in the example of FIG. 4A, k=1, 2, 3 in the example of FIG. 2B and k=1, 2, 3, 4, 5, 6, 7 in the example of FIG. 2C).

In case of the SLC memory cell, during a read operation a threshold voltage below the hard reference voltage $V_1$ represents the symbol "1", and a threshold voltage above the hard reference voltage $V_1$ represents the symbol "0".

In case of the MLC memory cell, during a read operation a threshold voltage below the hard reference voltage $V_1$ represents the symbol "11", a threshold voltage between the hard reference voltages $V_1$ and $V_2$ represents the symbol "01", a threshold voltage between the hard reference voltages $V_2$ and $V_3$ represents the symbol "00", and a threshold voltage above the hard reference voltage $V_3$ represents the symbol "10".

In case of the TLC memory cell and in the exemplary considered coding distributions, during a read operation, a threshold voltage below the hard reference voltage $V_1$ represents the symbol "111", a threshold voltage between the hard reference voltages $V_1$ and $V_2$ represents the symbol "011", a threshold voltage between the hard reference voltages $V_2$ and $V_3$ represents the symbol "001", a threshold voltage between the hard reference voltages $V_3$ and $V_4$ represents the symbol "101", a threshold voltage between the hard reference voltages $V_4$ and $V_5$ represents the symbol "100", a threshold voltage between the hard reference voltages $V_5$ and $V_6$ represents the symbol "000", a threshold voltage between the hard reference voltages $V_6$ and $V_7$ represents the symbol "010", and a threshold voltage above the hard reference voltage $V_7$ represents the symbol "110".

To read a memory cell, the threshold voltage of the memory cell is compared to the hard reference voltages $V_k$. Typically, reading a memory cell that stores a symbol of m bits may require, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

However, the increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference and retention, which translates into partially overlapping areas of adjacent threshold voltage distributions $D_j$ (shown in FIG. 4A and in the bottom drawings of FIGS. 2B and 2C) and, hence, into the increasing of the number of bit errors.

In order to compensate for larger bit errors, and to increase SSD device reliability, "Forward Error Correction" has been proposed (and typically implemented in the SSD controller) for locating and correcting bit errors. According to "Forward Error Correction" principles, the bits to be stored are encoded in a redundant way (e.g., by adding parity bits) by means of an "Error Correction Code" (ECC code), so that redundancy allows detecting a limited number of bit errors that may occur anywhere in the read bits, and to correct these errors without rereading. Generally, the number of detectable and correctable bit errors increases as the number of parity bits in the ECC code increases.

The probability of corrupted read bits, which therefore contains incorrect bits, before correction is referred to as "Raw Bit Error Rate" (RBER). The RBER is typically estimated (e.g., by the SSD controller) according to a shape of the threshold voltage distributions $D_D$, and particularly according to the overlapping areas of the adjacent threshold voltage distributions $D_j$.

As a result of the advances in memory cell technology, the RBER for selected memory cells is increasing. The RBER observed after application of the ECC code is referred to as "Frame Bit Error Rate" (FER), whereas the FER divided by the number of read bits is referred to as "Uncorrectable Bit Error Rate" (UBER).

The acceptable UBER is often dependent upon the application in which the SSD device is intended to be employed. In the case of price sensitive, consumer applications, which experience a relatively low number of accesses (e.g., program/erase cycles), the SSD device may tolerate a higher UBER as compared to a high-end application experiencing a relatively high number of accesses, such as an enterprise application.

To achieve an acceptable UBER, especially for enterprise applications, ECC codes such as "Low-Density Parity-Check" (LDPC) codes have been widely used (both alone and in combination with other ECC codes), which allow determining each bit value by means of hard bits (i.e., the read bits resulting from comparisons to the hard reference voltages $V_k$) and of additional information including soft bits and an indication of the reliability of each read (hard and soft) bit typically evaluated according to RBER—the decoding based on the hard and soft bits being referred to as hard and soft decoding, respectively.

In the known solutions, the soft bits mainly arise from multiple read operations. Indeed, according to a common approach, when a read operation takes place on the selected memory cells, and the number of bit errors is found to be higher than correction capabilities of the "Forward Error Correction", the flash memory device (e.g., the SSD controller thereof) is typically configured to reread the selected memory cells at different values of the reference voltages to attempt to establish the bits in those areas of the threshold voltage distributions $D_j$ wherein bit error is most likely. Such multiple readings are typically carried out by moving the hard reference voltages $V_k$ in a neighborhood thereof, thus obtaining a number of additional reference voltages (or soft reference voltages) $V_{kA}$-$V_{kF}$ associated with each hard reference voltage $V_k$ (in the following the overall reference voltages including both the hard reference voltages $V_k$ and the associated soft reference voltages $V_{kA}$-$V_{kF}$ will be also denoted, as a whole, by reference voltages $V_{kA},V_{kA}$-$V_{kF}$ for the sake of conciseness).

According to a common approach, the indication of the reliability of each read (hard and soft) bit is in the form of LLR value. The hard and soft bits and the associated LLR values are typically located in tables (usually referred to as LLR tables), which are stored in the SSD device and are used to perform soft decoding.

SUMMARY OF THE INVENTION

The Applicant has recognized that nowadays SSD devices, especially those currently most widespread (i.e., the SSD devices based on MLC and TLC technologies, hereinafter referred to as MLC and TLC SSD devices) are not satisfactory.

According to the Applicant, this is substantially due to the fact that hard decoding has limited error correction capabilities, and that soft decoding is a relatively frequent occurrence after unsuccessful hard decoding.

However soft decoding typically involves high computational effort, which translates into high read access times (and, hence, in latency overhead), especially in nowadays SSD devices, which are smaller and smaller and whose bits per memory cell are increasingly growing.

The Applicant has tackled the above-discussed issues, and has devised a SSD device with improved LLR tables, and a method implemented by the SSD device that, thanks to the improved LLR tables, allows limiting soft decoding as much as possible.

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect thereof).

More specifically, an aspect of the present invention relates to a solid state storage device. The solid state storage device comprises a plurality of memory cells each one programmable to store a bit pattern among a plurality of bit patterns; each bit pattern is associated with a corresponding nominal threshold voltage of the memory cells; memory cells programmed to store a same bit pattern among said plurality of bit patterns exhibit actual threshold voltages that are variable over the memory cells around the corresponding nominal threshold voltage thereby defining a respective threshold voltage distribution associated with that same bit pattern. Pairs of adjacent bit patterns, which are associated with corresponding adjacent nominal threshold voltages, can be discriminated, during a read operation, by respective first reference voltages between the corresponding adjacent nominal threshold voltages. The solid state storage device also comprises a controller for storing a plurality of LLR tables each one associated with a respective one of said first reference voltages. Each LLR table contains a plurality of bit pattern combinations, each bit pattern combination comprising a first bit pattern, among said plurality of bit patterns, that may result from a read operation of the memory cells with the respective first reference voltage, a second bit pattern, among said plurality of bit patterns, that may result from a read operation of the memory cells with a second reference voltage higher than the first reference voltage, and a third bit pattern, among said plurality of bit patterns, that may result from a read operation of the memory cells with a third reference voltage lower than the first reference voltage; the first, second and third bit patterns of each bit pattern combination identify, based on the respective associated threshold voltage distributions and on the respective first, second and third reference voltages, respective intervals of possible threshold voltages, among the respective actual threshold voltages, that may be exhibited by the memory cells. Each LLR table also contains, for each bit pattern combination, an error information when the intervals of possible threshold voltages identified by the first, second and third bit patterns of that bit pattern combination do not overlap at least partly to each other, or a LLR value indicative of an outcome bit pattern and of an indication of reliability of the outcome bit pattern otherwise.

According to an embodiment of the present invention, the first reference voltages are hard reference voltages, and the second and third reference voltages are soft reference voltages associated with the hard reference voltages.

According to an embodiment of the present invention, the LLR value ranges between first and second LLR values around a third LLR value indicative of complete uncertainty of the outcome bit pattern; the error information comprises said third LLR value.

According to an embodiment of the present invention, said third LLR value is 0.

According to an embodiment of the present invention, the LLR tables of said plurality of LLR tables are determined during a characterization phase of the solid state storage device. The controller is configured to, after a read operation of memory cells providing a plurality of read bit pattern combinations including at least one read bit pattern combination corresponding to a bit pattern combination that, in the respective LLR table, has the error information:

set the at least one read bit pattern combination at an arbitrary outcome bit pattern, and hard decode the plurality of the read bit pattern combinations based on the at least one read bit pattern combination set at the arbitrary outcome bit pattern.

According to an embodiment of the present invention, in case of failure of said hard decoding, the controller is configured to:

set the at least one read bit pattern combination at a further arbitrary outcome bit pattern different from said arbitrary bit pattern, and further hard decode the plurality of the read bit pattern combinations based on the at least one read bit pattern combination set at the further arbitrary outcome bit pattern.

According to an embodiment of the present invention, in case of failure of said further hard decoding, the controller is configured to:

set the at least one read bit pattern combination with an arbitrary LLR value, and soft decode the plurality of the read bit pattern combinations based on the LLR values and on the arbitrary LLR value set for the at least one read bit pattern combination.

According to an embodiment of the present invention, the LLR value ranges between first and second LLR values around a third LLR value indicative of complete uncertainty of the outcome bit pattern; the arbitrary LLR value comprises said third LLR value.

According to an embodiment of the present invention, said soft decoding is based on a "Low Density Parity Check" (LDPC) code.

According to an embodiment of the present invention, the memory cells are flash memory cells.

According to an embodiment of the present invention, said memory cells are NAND flash memory cells.

Another aspect of the present invention relates to a controller for a solid state storage device. The solid state storage device comprises a plurality of memory cells each one programmable to store a bit pattern among a plurality of bit patterns; each bit pattern being associated with a corresponding nominal threshold voltage of the memory cells, wherein memory cells programmed to store a same bit pattern among said plurality of bit patterns exhibit actual threshold voltages that are variable over the memory cells around the corresponding nominal threshold voltage thereby defining a respective threshold voltage distribution associated with that same bit pattern, and wherein pairs of adjacent bit patterns, which are associated with corresponding adjacent nominal threshold voltages, can be discriminated, during a read operation, by respective first reference voltages between the corresponding adjacent nominal threshold voltages. The controller stores a plurality of LLR tables each one associated with a respective one of said first reference voltages. Each LLR table contains a plurality of bit pattern combinations, each bit pattern combination comprising a first bit pattern, among said plurality of bit patterns, that may result from a read operation of the memory cells with the respective first reference voltage, a second bit pattern, among said plurality of bit patterns, that may result from a read operation of the memory cells with a second reference voltage higher than the first reference voltage, and a third bit pattern, among said plurality of bit patterns, that may result from a read operation of the memory cells with a third reference voltage lower than the first reference voltage, wherein the first, second and third bit patterns of each bit pattern combination identify, based on the respective associated threshold voltage distributions and on the respective first, second and third reference voltages, respective intervals of possible threshold voltages, among the respective actual threshold voltages, that may be exhibited by the memory cells. Each LLR table also contains, for each bit pattern combination, an error information when the intervals of possible threshold voltages identified by the first, second and third bit patterns of that bit pattern combination do not overlap at least partly to each other, or a LLR value indicative of an outcome bit pattern and of an indication of reliability of the outcome bit pattern otherwise.

According to an embodiment of the present invention, the first reference voltages are hard reference voltages, and the second and third reference voltages are soft reference voltages associated with the hard reference voltages.

According to an embodiment of the present invention, the LLR value ranges between first and second LLR values around a third LLR value indicative of complete uncertainty of the outcome bit pattern; the error information comprises said third LLR value.

According to an embodiment of the present invention, said third LLR value is 0.

According to an embodiment of the present invention, the LLR tables of said plurality of LLR tables are determined during a characterization phase of the solid state storage device. The controller is configured to, after a read operation of memory cells providing a plurality of read bit pattern combinations including at least one read bit pattern combination corresponding to a bit pattern combination that, in the respective LLR table, has the error information:

set the at least one read bit pattern combination at an arbitrary outcome bit pattern, and hard decode the plurality of the read bit pattern combinations based on the at least one read bit pattern combination set at the arbitrary outcome bit pattern.

According to an embodiment of the present invention, in case of failure of said hard decoding, the controller is configured to:

set the at least one read bit pattern combination at a further arbitrary outcome bit pattern different from said arbitrary bit pattern, and further hard decode the plurality of the read bit pattern combinations based on the at least one read bit pattern combination set at the further arbitrary outcome bit pattern.

According to an embodiment of the present invention, in case of failure of said further hard decoding, the controller is configured to:

set the at least one read bit pattern combination with an arbitrary LLR value, and soft decode the plurality of the read bit pattern combinations based on the LLR values and on the arbitrary LLR value set for the at least one read bit pattern combination.

According to an embodiment of the present invention, the LLR value ranges between first and second LLR values around a third LLR value indicative of complete uncertainty of the outcome bit pattern; the arbitrary LLR value comprises said third LLR value.

According to an embodiment of the present invention, said soft decoding is based on a "Low Density Parity Check" (LDPC) code.

Another aspect of the present invention relates to a method comprising performing a characterization of a solid state storage device, wherein the solid state storage device comprises a plurality of memory cells each one programmable to store a bit pattern among a plurality of bit patterns, each bit pattern being associated with a corresponding nominal threshold voltage of the memory cells, wherein memory cells programmed to store a same bit pattern among said plurality of bit patterns exhibit actual threshold voltages that are variable over the memory cells around the corresponding nominal threshold voltage thereby defining a respective threshold voltage distribution associated with that same bit pattern, and wherein pairs of adjacent bit patterns, which are associated with corresponding adjacent nominal threshold voltages, can be discriminated, during a read operation, by respective first reference voltages between the corresponding adjacent nominal threshold voltages. The method comprises, during said characterization, storing in a controller of the solid state storage device a plurality of LLR tables, each one associated with a respective one of said first reference voltages, wherein each LLR table contains a plurality of bit pattern combinations, each bit pattern combination comprising a first bit pattern, among said plurality of bit patterns, that may result from a read operation of the memory cells with the respective first reference voltage, a second bit pattern, among said plurality of bit patterns, that may result from a read operation of the memory cells with a second reference voltage higher than the first reference voltage, and a third bit pattern, among said plurality of bit patterns, that may result from a read operation of the memory cells with a third reference voltage lower than the first reference voltage; the first, second and third bit patterns of each bit pattern combination identify, based on the respective associated threshold voltage distributions and on the respective first, second and third reference voltages, respective intervals of possible threshold voltages, among the respective actual threshold voltages, that may be exhibited by the memory cells. Each LLR table also contains, for each bit pattern combination, an error information when the intervals of possible threshold voltages identified by the first, second and third bit patterns of that bit pattern combination do not overlap at least partly to each other, or a LLR value indicative of an outcome bit pattern and of an indication of reliability of the outcome bit pattern otherwise.

According to an embodiment of the present invention, the first reference voltages are hard reference voltages, and the second and third reference voltages are soft reference voltages associated with the hard reference voltages.

According to an embodiment of the present invention, the LLR value ranges between first and second LLR values around a third LLR value indicative of complete uncertainty of the outcome bit pattern; the error information comprises said third LLR value.

According to an embodiment of the present invention, said third LLR value is 0.

According to an embodiment of the present invention, after the characterization of the solid state storage device the method further comprises, after a read operation of memory cells providing a plurality of read bit pattern combinations including at least one read bit pattern combination corresponding to a bit pattern combination that, in the respective LLR table, has the error information:

setting the at least one read bit pattern combination at an arbitrary outcome bit pattern, and hard decoding the plurality of the read bit pattern combinations based on the at least one read bit pattern combination set at the arbitrary outcome bit pattern.

According to an embodiment of the present invention, the method further comprises, in case of failure of said hard decoding:

setting the at least one read bit pattern combination at a further arbitrary outcome bit pattern different from said arbitrary bit pattern, and further hard decoding the plurality of the read bit pattern combinations based on the at least one read bit pattern combination set at the further arbitrary outcome bit pattern.

According to an embodiment of the present invention, the method further comprises, in case of failure of said further hard decoding:

setting the at least one read bit pattern combination with an arbitrary LLR value, and soft decoding the plurality of the read bit pattern combinations based on the LLR values and on the arbitrary LLR value set for the at least one read bit pattern combination.

According to an embodiment of the present invention, the LLR value ranges between first and second LLR values around a third LLR value indicative of complete uncertainty of the outcome bit pattern; the arbitrary LLR value comprises said third LLR value.

According to an embodiment of the present invention, said soft decoding is based on a "Low Density Parity Check" (LDPC) code.

BRIEF DESCRIPTION OF THE ANNEXED DRAWINGS

Figure 1B:
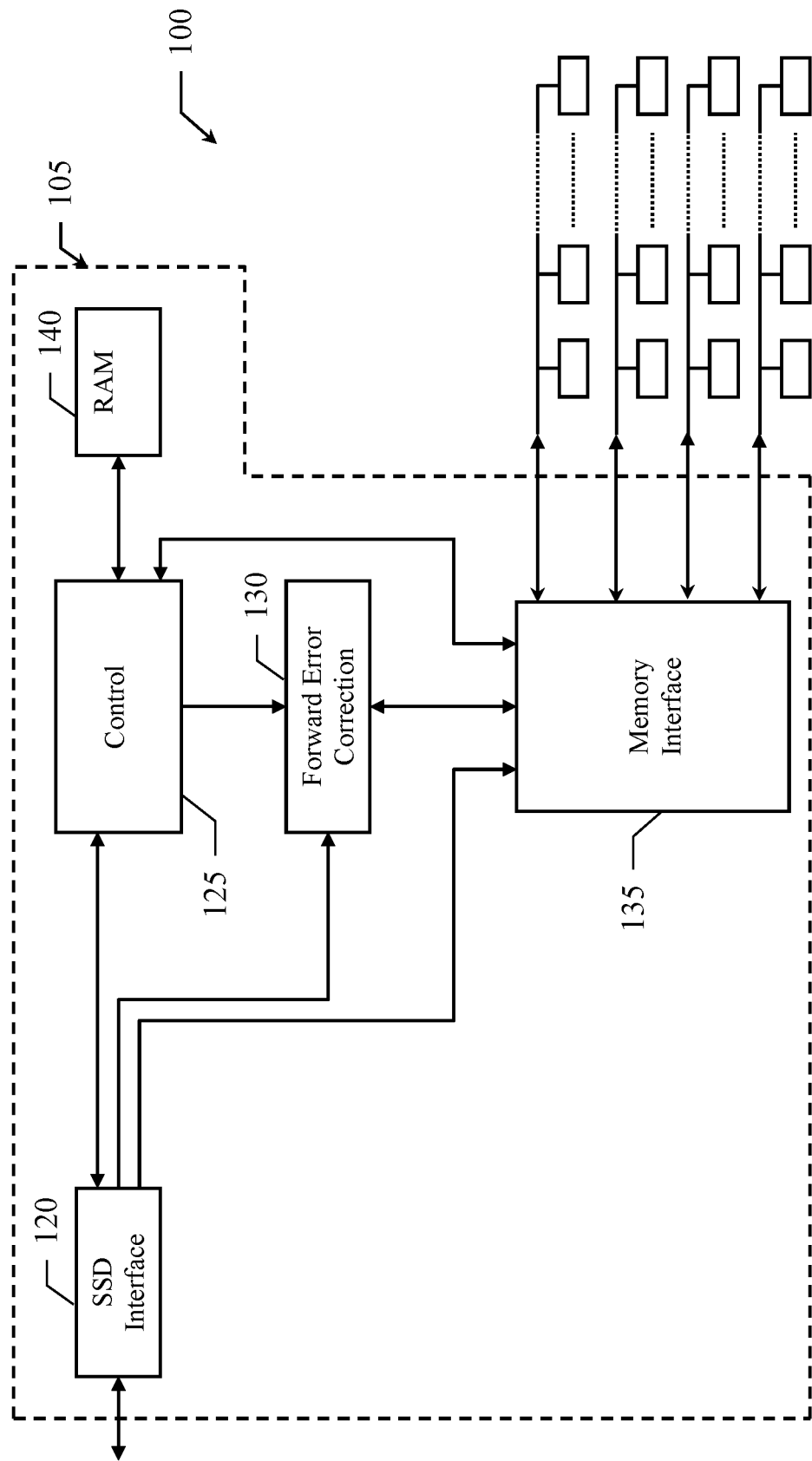
Figure 3A:
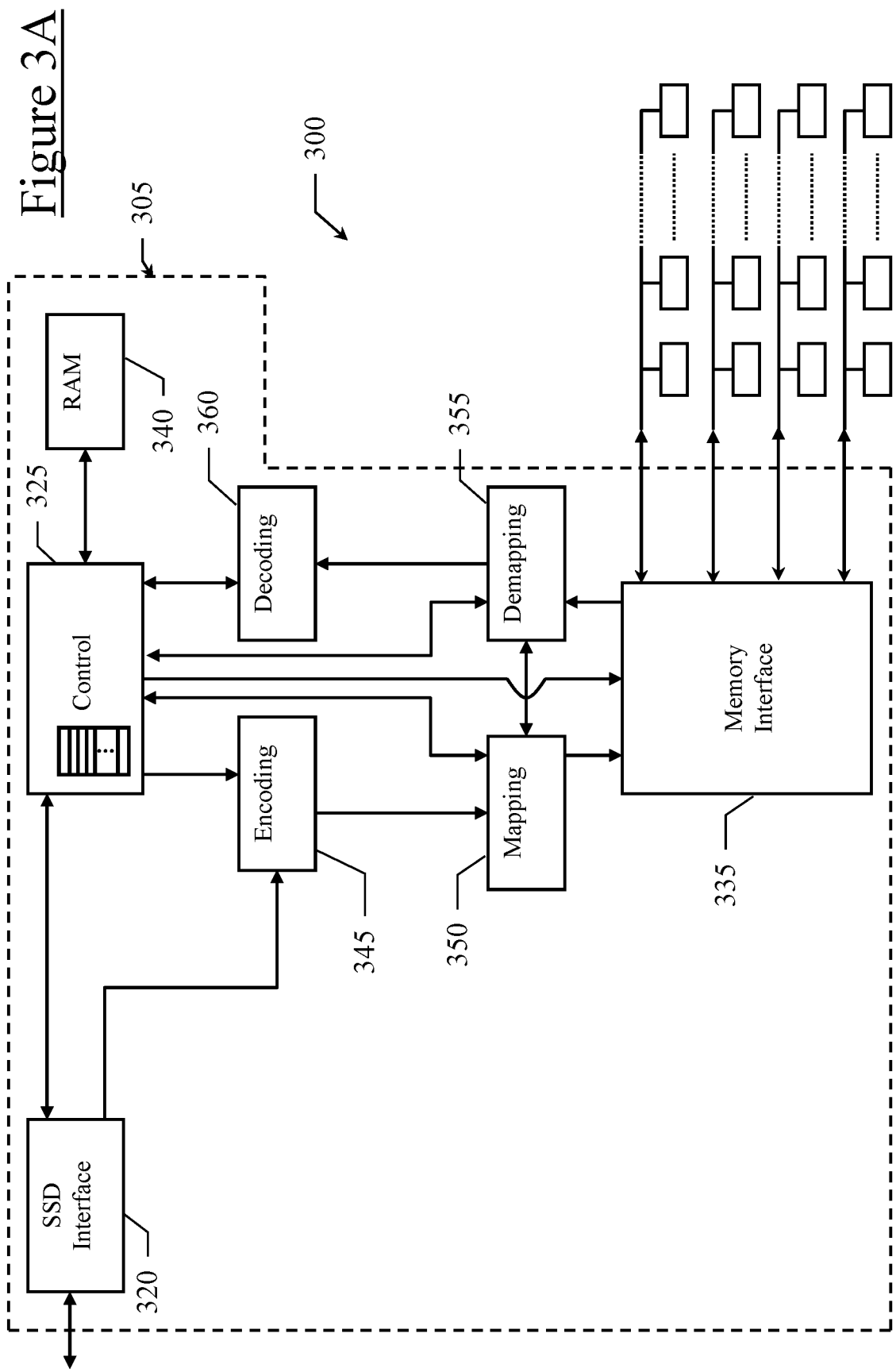
Figure 3B:
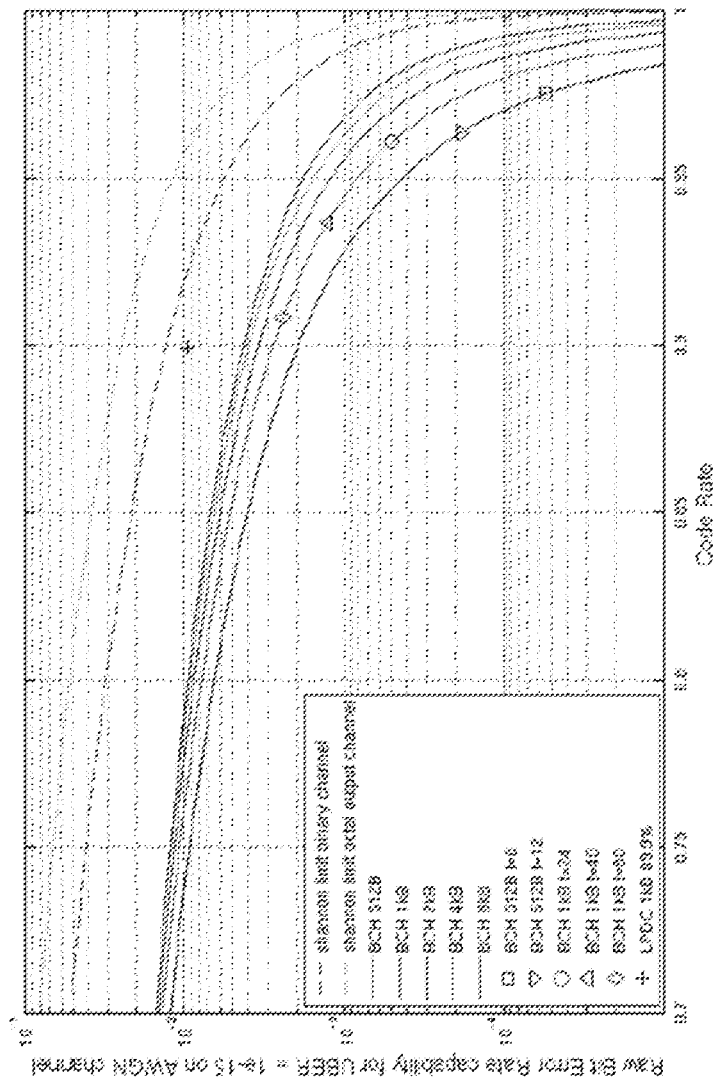
Figure 4B:
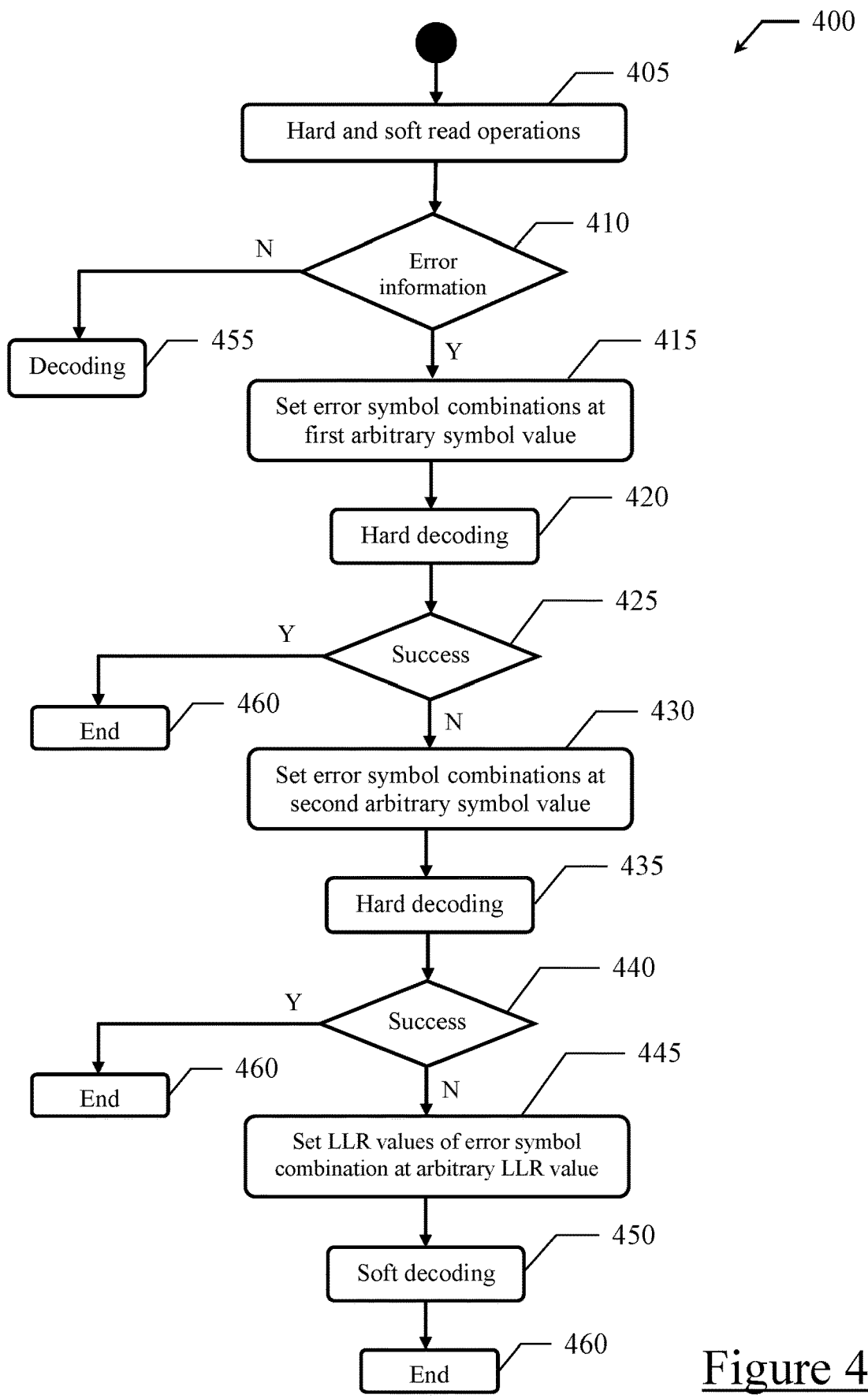

These and other features and advantages of the present invention will be made apparent by the following description of some exemplary and non-limitative embodiments thereof. For its better intelligibility, the following description should be read making reference to the attached drawings, wherein:

FIG. 1A schematically shows a simplified architecture of a SSD device known in the state of the art;

FIG. 1B schematically shows a simplified architecture of a typical SSD controller of said SSD device;

FIG. 2A schematically shows a simplified architecture of a typical flash memory die of said SSD device;

FIGS. 2B and 2C schematically show exemplary ideal and real threshold voltage distributions of MLC memory cells and of TLC memory cells, respectively, of said flash memory die;

FIG. 3A schematically shows a simplified architecture of a SSD controller according to the present invention;

FIG. 3B shows a diagram of "Raw Bit Error Rate" capability, with respect to code rate, of some exemplary ECC codes, including a "Low Density Parity Check" code that can be used in the "Forward Error Correction" unit of the SSD controller of FIG. 3A;

FIG. 4A schematically shows exemplary real threshold voltage distributions of SLC memory cells of said flash memory die, and a conceptual improved LLR table derived by such threshold voltage distributions according to an embodiment of the present invention, and FIG. 4B schematically shown an activity diagram of a decoding procedure carried out by the SSD controller of FIG. 3A according to an embodiment of the present invention.

DETAILED DESCRIPTION OF PREFERRED EMBODIMENTS OF THE INVENTION

With reference to the drawings, FIG. 1A schematically shows a simplified architecture of a "Solid State Drive" device (SSD device) 100 known in the state of the art.

The SSD device 100 preferably comprises a controller (e.g., a processor and/or other control circuitry, referred to herein as SSD controller) 105, a plurality of non-volatile memory chips (e.g. flash memory chips, such as NAND flash memory chips) $110_i$ for storing bits even in the absence of external power supply (i=1, 2, 3, . . . , I, with I=64 in the example at issue), and a plurality of (e.g., synchronous and/or asynchronous) channels $115_j$ (j=1, 2, 3, . . . , J, with J=4 in the example at issue) communicably coupling the SSD controller 105 and the memory chips $110_i$ to each other—in the exemplary illustration, each channel $115_j$ communicably couples the SSD controller 105 to a set of 16 memory chips $110_i$ (e.g., with the channels $115_1$, $115_2$, $115_3$ and $115_4$ that communicably couple the SSD controller 105 to the memory chips $110_1$-$110_{16}$, $110_{17}$-$110_{32}$, $110_{33}$-$110_{48}$ and $110_{49}$-$110_{64}$, respectively).

With reference also to FIG. 1B, it schematically shows, in terms of operating units, a simplified architecture of a typical SSD controller 105—the term "unit" being herein intended to emphasize functional (rather than implementation) aspects thereof (each unit including, for example, hardware or circuitry with processing and/or storing capabilities). For the sake of completeness, such a figure also shows, with a smaller size, the memory chips $110_i$ and the channels $115_j$ (the memory chips and the channels being unnumbered in such a figure for ease of illustration).

The SSD controller 105 comprises a SSD interface unit 120 allowing data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 120. The SSD interface unit 120 may be in the form of a standardized interface. For example, when the SSD device 100 is used for data storage in a computing system, the SSD interface unit 120 can be a "Serial advanced technology attachment" (SATA), a "Peripheral Component Interconnect express" (PCIe), or a "Universal Serial Bus" (USB).

Data exchanged between the SSD device 100 (through the SSD interface unit 120 of the SSD controller 105) and the host may comprise, but are not limited to, information bits to be stored (i.e., the information bits to be written in the memory chips $110_i$), read information bits (i.e., the information bits stored in, and read from, the memory chips $110_i$), user commands indicative of the operations to be performed by the SSD controller 105 on the memory chips $110_i$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by bi-directional arrow connections between the units.

The SSD controller 105 also comprises a control unit 125 (or more thereof) for managing SSD device 100 operation, such as for receiving and processing the user commands from the SSD interface unit 120, handling bit transport to the memory chips $110_i$ along the channels 115 and bit transport to and from the SSD interface unit 120, and coordinating enabling and/or disabling of the memory chips $110_i$ according to the user commands.

In order to compensate for large "Raw Bit Error Rate" (RBER), and to increase reliability of the SSD device 100, the SSD controller 105 also comprises a "Forward Error Correction" (FEC) unit 130 for locating and correcting bit errors. According to "Forward Error Correction" principles, the information bits to be stored in the memory chips $110_i$ (and provided either by the control unit 125 or, directly, from the SSD interface unit 105) are encoded in a redundant way (e.g., by adding parity bits) by means of an "Error Correction Code" (ECC code), so that redundancy allows detecting a limited number of bit errors that may occur anywhere in the read bits, and to correct these errors, during decoding, without rereading. The FEC unit 130 may comprise discrete components—such as an "Application Specific Integrated Circuit" (ASIC)—external to the control unit 125 (as herein assumed by way of example only), or the FEC unit 130 may reflect functionalities that do not necessarily have a discrete physical form separate from the control unit 125.

In order to ease bit transport between the SSD controller 105 and the memory chips $110_i$ along the respective channels $115_j$, the SSD controller 105 comprises one (as herein exemplary illustrated) or more memory interface units 135—alternatively, a memory interface unit 135 for each channel $115_j$ may be provided, or a memory interface unit 135 for each memory chip $110_i$, or for each group of memory chips $110_i$ may be provided.

As conceptually depicted in the figure by (unidirectional or bi-directional) arrow connections, which however should not be construed limitatively, the memory interface unit 135 is communicably coupled in a unidirectional manner to the SSD interface 120 (e.g., for receiving from it the information bits to be written when no ECC code is requested), and in a bi-directional manner to the control unit 125 (e.g., for receiving control information from it, such as an indication of the memory chips $110_i$ to be enabled for write or read operations, and for providing to it the read bits to be transmitted to the SSD interface unit 120) and to the FEC unit 130 (for example, for receiving encoded bits from it, e.g. including the information and parity bits, and for providing to it the read bits to be decoded before transmitting to the control unit 125, and hence to the SSD interface unit 120, the read information bits).

The SSD controller 105 further comprises a memory unit (e.g., a "Random Access Memory", RAM) 140 communicably coupled (in a bi-directional manner) to the control unit 125 for receiving and storing statistical information (such as number of program/erase cycles, and number of bit errors) and/or diagnostic information (such as working temperature, power consumption) retrieved and/or calculated by the control unit 125 (e.g. based on SSD device 100 operation and/or on sensors and/or diagnostic circuits within the SSD device 100, not shown), and, when required, for feeding the control unit 125 with the stored information.

A typical flash memory chip 110$_i$ may comprise one or more flash memory dice.

A typical flash memory die, illustrated in FIG. 2A and denoted by the number reference 200, comprises one (as depicted) or more memory arrays 205 of memory cells (e.g., NAND flash memory cells) 210 arranged in rows and columns. Each memory array 205 is typically divided into multiple memory pages. Broadly speaking, each memory page comprises a number of memory cells 210 that can be programmed and read simultaneously. A number of memory pages form a memory block, and the size of the memory block equals to the product of the size of the memory page and the total number of memory pages in the memory block.

Each memory cell 210 is programmable to store a bit or group of bits (or symbol, or bit pattern) among a plurality of bit patterns, wherein each bit pattern identifies or is associated with a respective logical state of the memory cell 210. Each memory cell 210 preferably comprises a floating gate transistor (not illustrated). Each bit pattern identifying a respective logical state of the memory cell 210 is physically stored in each memory cell 210 in the form of electric charge in the floating gate, which defines a corresponding threshold voltage of the transistor. The number of bits each memory cell 210 is capable of storing depends on memory cell technology. For example, in "Single-Level Cell" (SLC) technology each memory cell (or SLC memory cell) is capable of storing one symbol (or bit pattern) comprising one bit (i.e. two logical states, 0 or 1, defining, i.e. being associated with, two threshold voltages), in "Multi-Level Cell" (MLC) technology each memory cell (or MLC memory cell) is capable of storing one symbol (or bit pattern) comprising more than one bit, typically two bits (i.e. four logical states, 00, 01, 10, or 11, defining, i.e. being associated with, four threshold voltages), whereas in "Tri-Level Cell" technology each memory cell (or TLC memory cell) is capable of storing one symbol (or bit pattern) comprising three bits (i.e. eight logical states, 000, 001, 010, 011, 100, 101, 110 or 111, defining, i.e. being associated with, eight threshold voltages).

While, ideally, all memory cells 210 in the flash memory die 200 should feature and be associated with same (nominal) threshold voltages for same logical states (or, equivalently, for same symbols), practically each threshold voltage associated with a corresponding logical state (or, equivalently, associated with a corresponding symbol) differs across the memory cells 210 and defines a respective threshold voltage distribution $D_j$ (typically, a Gaussian-type probability distribution), thus resulting in a number of threshold voltage distributions $D_j$ equal to the possible logical states each memory cell 210 can take; otherwise stated, memory cells programmed to store a same bit pattern among the plurality of bit patterns exhibit actual threshold voltages that are variable over the memory cells 210 around the corresponding nominal threshold voltage thereby defining a respective threshold voltage distribution $D_j$ associated with that same bit pattern. This is schematically shown in FIG. 4A, in the top drawing of FIG. 2B for a MLC memory cell and in the top drawing of FIG. 2C for a TCL memory cell.

As discussed in the introductory part of this description, the threshold voltage distributions $D_j$ are (ideally) spaced apart from one another, and a corresponding hard reference voltage $V_k$ is set between each pair of adjacent threshold voltage distributions $D_j$ for sensing/reading the logical state of the memory cells 210 (k=1 in the example of FIG. 4A, k=1, 2, 3 in the example of FIG. 2B and k=1, 2, 3, 4, 5, 6, 7 in the example of FIG. 2C). Therefore, each pair of adjacent bit patterns, which are associated with a corresponding adjacent pair of nominal threshold voltages (and hence with a corresponding adjacent pair of threshold voltage distributions $D_j$), can be discriminated, during a read operation, by a respective hard reference voltage $V_k$ which is between the corresponding adjacent nominal threshold voltages.

In the case of SLC memory cell, during a read operation a threshold voltage below the hard reference voltage V/represents the symbol "1", and a threshold voltage above the hard reference voltage $V_1$ represents the symbol "0".

In the case of MLC memory cell, during a read operation, a threshold voltage below the hard reference voltage $V_1$ represents the symbol "11", a threshold voltage between the hard reference voltages $V_1$ and $V_2$ represents the symbol "01", a threshold voltage between the hard reference voltages $V_2$ and $V_3$ represents the symbol "00", and a threshold voltage above the hard reference voltage $V_3$ represents the symbol "10".

In the case of TLC memory cell and in the exemplary considered coding distributions, during a read operation, a threshold voltage below the hard reference voltage $V_1$ represents the symbol "111", a threshold voltage between the hard reference voltages $V_1$ and $V_2$ represents the symbol "011", a threshold voltage between the hard reference voltages $V_2$ and $V_3$ represents the symbol "001", a threshold voltage between the hard reference voltages $V_3$ and $V_4$ represents the symbol "101", a threshold voltage between the hard reference voltages $V_4$ and $V_5$ represents the symbol "100", a threshold voltage between the hard reference voltages $V_5$ and $V_6$ represents the symbol "000", a threshold voltage between the hard reference voltages $V_6$ and $V_7$ represents the symbol "010", and a threshold voltage above the hard reference voltage $V_7$ represents the symbol "110".

To read a memory cell 210, the threshold voltage of the memory cell 210 is compared to the hard reference voltages $V_k$. According to an embodiment, reading a memory cell 210 that stores a symbol of m bits requires, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

The two bits stored in a MLC memory cell are usually referred to as "Least Significant Bit" (LSB bit) and "Most Significant Bit" (MSB bit)—with reference to the conceptual representation of vertically arranged symbol associated with the respective threshold voltage distribution $D_j$, the LSB and MSB bits are assumed to be the bottom and top bits, respectively—whereas the three bits stored in a TLC memory cell are usually referred to as "Least Significant Bit" (LSB bit), "Center Significant Bit" (CSB bit) and "Most Significant Bit" (MSB bit)—with reference to the conceptual representation of vertically arranged symbol associated with the respective threshold voltage distribution $D_j$, the LSB, CSB and MSB bits are assumed to be the bottom, central and top bits, respectively. The terms LSB, CSB and MSB are used only as a reference to specific bits within the memory cell, and do not imply that certain bits are more important than others (in this respect, any other suitable terminology can also be used).

According to a typical implementation, different bits in a given group of memory cells 210 correspond to different memory pages.

For example, a group of eight-logical states (TLC) memory cells 210 can be used for storing three memory pages, a first page in the LSB bits of the memory cells of the group (thus referred to as LSB page), a second page in the CSB bits of the memory cells of the group (thus referred to as CSB page), and a third page in the MSB bits of the memory cells of the group (thus referred to as MSB page). Similarly, a group of four-logical states (MLC) memory cells can be used for storing LSB and MSB pages.

Back to FIG. 2A, the memory die 200 preferably comprises peripheral circuits (such as decoders, multiplexers, drivers, buffers, sense amplifiers), which, being not relevant for the present description, are represented in the figure by means of a single functional block (denoted by the number reference 215). Such peripheral circuits 215 are configured, in general, for accessing selected (pages of) memory cells (as conceptually represented in the figure by arrow connection between the peripheral circuits 215 and the memory array 205) and for running selected operations thereon (e.g. write, read, diagnosis operations).

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference, mainly arising from floating gate coupling effect between a target memory cell (i.e., a memory cell to be read or written) and the surrounding memory cells, and retention, i.e. a loss of the capability of the memory cells to retain the stored bits over time caused by progressive damage of the oxide layer (due to the high electrical fields applied at each program/erase operation) that determines an undesired flow of electrons away/in the floating gate.

Cell-to-cell interference and retention translate into partially overlapping areas of adjacent threshold voltage distributions $D_j$ (shown in FIG. 4A, and in the bottom drawings of FIGS. 2B and 2C) and, hence, into increasing of the probability of the number of bit errors per unit time (i.e., the RBER).

With reference now to FIG. 3A, it schematically shows, in terms of operating units, a simplified architecture of a SSD controller 305 according an embodiment the present invention. For the sake of completeness, such a figure also shows, in a smaller size, the memory chips $110_i$ and the channels $115_j$ (equivalent to those illustrated in the previous figures), which identify, together with the SSD controller 305, a SSD device 300. Similarly to the above, the term "unit" is herein intended to emphasize functional (rather than implementation) aspects thereof. Indeed, without losing of generality, each unit of the SSD controller 305 may be physically implemented by software, hardware, and/or a combination thereof, and/or within any pre-existing or dedicated entity. In this respect, the operating units may also intended to represent corresponding method steps of a method according to the present invention.

As visible in the figure, the SSD controller 305 comprises, similarly to the SSD controller 105, a SSD interface 320, a control unit 325, a memory interface unit 335, and a memory unit 340, which will not be discussed again for the sake of conciseness.

The SSD controller 305 also comprises an encoding unit 345 for encoding the bits to be stored in the memory array 205 (i.e., the information bits) by means of an ECC code. According to an embodiment of the present invention, the encoding unit 345, and the respective decoding unit (discussed in the following), are implemented in the FEC unit 130.

Preferably, the ECC code is an ECC code allowing soft decoding—or, otherwise stated, an ECC code that allows determining each bit value by means of hard bits (i.e., the read bits resulting from comparisons to the hard reference voltages $V_k$) and of additional information including soft bits and an indication of the reliability of each read (hard and soft) bit typically evaluated or estimated according to RBER—the decoding based on the hard bits being referred to as hard decoding and the decoding based on the hard and soft bits being referred to as soft decoding. More preferably, the ECC code is a "Low Density Parity-Check" (LDPC) code—hence, the encoding unit 345 will be referred to as LDPC encoding unit 345 and the corresponding encoded bits will be referred to as LDPC encoded bits. LDPC code is a linear ECC code (constructed by using a sparse bipartite graph) that allows transmitting data over a noisy channel. LDPC code is a capacity-approaching code, which means that practical constructions exist that allow the noise threshold to be set very close to the theoretical maximum (the Shannon limit given by the Shannon theorem) for a symmetric memory-less channel.

The Shannon theorem specifies the maximum rate at which data can be transmitted over a channel of a specified bandwidth in the presence of noise. More specifically, according to the Shannon theorem, a bound on the maximum amount of error-free data that can be transmitted with a specified bandwidth in the presence of the noise interference is set, assuming that the signal power is bounded, and that the Gaussian noise process is characterized by a known power or power spectral density. The noise threshold defines an upper bound for the channel noise, up to which the probability of data errors can be made as small as desired.

Thanks to soft decoding allowed by LDPC code, for a given code rate (the ratio between the information bits to the (LDPC, in the case at issue) encoding unit and the total number of bits created by the encoding unit, the total number of bits created by the encoding unit including the parity bits), LDPC code approaches the Shannon limit more than ECC codes typically used in prior art solutions (such as Bose-Chaudhuri-Hocquenghem (BCH) codes), which translates into area saving while maximizing the probability of accurately recovering the bits after a read operation.

This is illustrated in FIG. 3B, which shows a diagram of "Raw Bit Error Rate", with respect to code rate, of LDPC code and of different BCH codes. In the figure it is also plotted the Shannon limit.

As visible in the figure, given a code rate of 0.9, LDPC code approaches the Shannon limit more than BCH code, whereas the same RBER can be achieved by means of the BCH code only with a code rate of 0.75 (which implies a 25% area overhead).

According to an embodiment, LDPC is a variable rate LDPC code, so that it may change the code rate depending on the RBER. Advantageously, the variable rate LDPC code is a "Quasi-Cyclic Low Density Parity Check" (QC LDPC) code. Broadly speaking, a QC LDPC code has a parity check matrix that is composed of circulant matrices of the same size. Each circulant matrix is a square matrix wherein each row is one degree of right-cyclic shift of the row above it (so that the first row is also the right-cyclic shift of the last row), and wherein each column is one degree of downward-cyclic shift of the column on the left (so that the first column is also the downward-cyclic shift of the rightmost column).

Thus, by enabling different rows/columns of the circulant matrices, the number of parity bits within the circulant matrices may be kept the same while changing the number of information bits within the circulant matrices, thus implying code rate changing. Alternatively, by splitting the rows and introducing a number of all zero circulant matrices, the number of parity bits within the circulant matrices may be changed, so that the parity check matrix becomes more sparse (and the number of parity bits and information bits, and hence the code rate, is changed).

Back to FIG. 3A, the SSD controller 305 also comprises a mapping unit 350 for "mapping" the LDPC encoded bits into mapped LDPC encoded bits (the mapped LDPC encoded bits representing the symbols to be written/programmed), thereafter the symbols can be stored in the memory chips $110_i$ (e.g., similarly to the above, by means of the memory interface unit 335 that transmits the symbols to the memory chips $110_i$, and thanks to control unit 325 action that controls addressing of the memory chips $110_i$ to be written/programmed). Preferably, as also conceptually illustrated by arrow connections between the SSD control unit 325, the encoding unit 345, the mapping unit 350, and the memory interface unit 335, the mapping unit 350 (and, hence, the mapping operation performed by it) can be selectively enabled by the control unit 325, and hence the LDPC encoded bits may be fed directly to the memory interface unit 335 when the mapping unit 350 is disabled. According to an embodiment, selective enabling of the mapping unit 350 takes place after a predetermined number of detected failures (e.g., bit errors). Additionally or alternatively, selective enabling of the mapping unit 350 can take place after a predetermined working period of the SSD device 300 from its first use (e.g., after the program/erase cycles stored in the memory unit 340 reaches a predetermined number), e.g. in order to compensate for decreasing performance affecting the SSD device 300 with its use.

The SSD controller 305 further comprises demapping 355 and LDPC decoding 360 units for carrying out demapping and decoding operations to the read symbols in order to extract the information bits therefrom (the demapping and LDPC decoding operations being substantially reverse operations with respect to the encoding and mapping operations carried out at LDPC encoding 345 and mapping 350 units, respectively).

As mentioned above, the LDPC decoding unit 360 is configured to perform a soft decoding of the read bits, i.e. it allows determining each bit value by means of the hard bits and of higher order (additional) information (preferably obtained from the memory cells during the error correction process) including soft bits and an indication of the reliability of each read (hard and soft) bit.

Preferably, the indication of the reliability of each read (hard and soft) bit is in the form of a "Log Likelihood Ratio" value (LLR, hereinafter, LLR value) associated with that bit (i.e., a weight indicative of the probability that the read bit is correct). By way of example only, in order to meet one or more parity checks of the ECC code, an LLR value higher than 0 may indicate a bit that is more likely a 0 than a 1, while an LLR value lower than 0 may indicate a bit that is more likely a 1 than a 0. Further, a greater magnitude of the LLR value may indicate a higher probability or reliability.

Thus, a bit with an LLR value equal to 15 is more likely to be a 0 than a bit with an LLR value equal to 5, and a bit with an LLR value equal to −15 is more likely to be a 1 than a bit with an LLR value equal to −5. An LLR value equal to 0 may instead indicate that the bit is equally likely to be a 0 or a 1 (and therefore correspond to a complete uncertainty about the bit value, i.e. the estimation is completely unreliable). By way of example only, for a given RBER, the LLR values for a set of five read bits may be [+15,+1,−15,−2,+2]. In other words, the LLR value represents an outcome information comprising an outcome symbol (or bit pattern) resulting from the read operation (the outcome symbol in a SLC memory cell being for example represented by the sign, positive or negative, associated with the LLR value) and an indication of reliability of the outcome symbol (the outcome symbol being for example represented by the magnitude or absolute value of the LLR value).

The LLR values depend on RBER, whose estimate in turns depends on the shape, and particularly on the overlap areas, of the threshold voltage distributions $D_j$—in the art, a number of techniques for estimating the RBER exist, which are typically developed autonomously by the manufacturers for their specific design needs and convenience. Thus, each RBER (estimate) is associated with respective LLR values. According to an embodiment of the present invention, these LLR values are arranged in tables (hereinafter, LLR tables), preferably stored in the control unit 325 of the SSD controller 305 (as schematically illustrated in the figure) and accessed by the LDPC decoding unit 360 when required.

The soft bits mainly arise from multiple read operations. Indeed, when a read operation takes place on the selected memory cells, and the number of bit errors is found to be higher than correction capabilities of the "Forward Error Correction", the SSD controller 305 is configured to reread the selected memory cells at different values of the reference voltages to attempt to establish the bits in those areas of the threshold voltage distributions $D_j$ wherein bit error is most likely. As visible in the bottom drawings of FIGS. 2B and 2C, such multiple readings are carried out by moving the hard reference voltages $V_k$ in a neighborhood thereof, thus obtaining a number of additional reference voltages (or soft reference voltages) $V_{kA}$-$V_{kF}$ associated with each hard reference voltage $V_k$—the read operations at the soft reference voltages $V_{kA}$-$V_{kF}$ provide the soft bits, and are typically denoted as soft read operations (as opposed to the read operations at the hard reference voltages $V_k$ providing the hard bits, which are typically denoted by hard read operations). In other words, soft bits (and the associated LLR values) provide additional information that can be used by the LDPC decoding unit 360 to speed up and/or to quickly converge. By way of example only, the soft reference voltages $V_{kA}$-$V_{kC}$ may be obtained by progressively decreasing the hard reference voltage $V_k$ by a 0.5V step, whereas the soft reference voltages $V_{kD}$-$V_{kF}$ may be obtained by progressively increasing the hard reference voltage $V_k$ by a 0.5V step.

Each LLR table is associated with a respective one of the hard reference voltages $V_k$, and typically comprises, for the respective hard reference voltage $V_k$ and associated soft reference voltages, a number of LLR values, wherein each LLR value is associated with a symbol (or bit pattern) combination (i.e., with a respective combination of hard and soft bits) resulting from the hard and soft read operations.

Reference will be now made to FIGS. 4A and 4B. FIG. 4A schematically shows exemplary real threshold voltage distributions of SLC memory cells, and a conceptual improved LLR table derived by such threshold voltage distributions according to an embodiment of the present invention, and FIG. 4B schematically shown an activity diagram of a decoding procedure 400 carried out by the SSD controller 305 of FIG. 3A according to an embodiment of the present invention.

According to embodiments of the present invention, the decoding procedure 400 is based on the improved LLR tables. In addition to LLR values (as in conventional LLR tables), an improved LLR table according to the present invention comprises an error information associated with one or more symbol combinations; as will be better discussed in the following, this error information may be conveniently used to limit or even avoid soft decoding.

The association of the error information to one or more symbol combinations is preferably performed in a characterization phase of the SSD device 300, the characterization phase including a known set of test operations aimed at evaluating electrical and operative parameters of the SSD device 300, such as the threshold voltage distributions of the memory cells and the hard and soft reference voltages to be set for read operations during normal operation of the SSD device 300 (i.e., when the SSD device is marketed and used by the end consumer); although the characterization phase of the SSD device 300 is not part of the decoding procedure 400, providing the improved LLR tables is a main prerequisite of the proposed decoding procedure 400, whereby the main steps of the characterization phase aimed at determining the improved LLR tables will be discussed here below first.

In the characterization phase, the threshold voltage distributions $D_j$ and the proper hard and soft read reference voltages of the memory cells are determined. As mentioned above, each threshold voltage distribution is indicative of a variability of the respective nominal threshold voltage over the plurality of memory cells of the SSD device 300. Just as an example, read retry mechanisms or variants thereof may be implemented in order to determine the threshold voltage distributions and the hard and soft read reference voltages, however this should not be construed as a limitation. Based on the hard and soft read reference voltages and on the threshold voltage distributions so determined, the improved LLR tables with the error information are determined as discussed here below. In the following, known operations that pertain to determination of conventional LLR tables will be described in a simplified manner so as not to obscure the description with unnecessary technical details. Moreover, for ease of description, the determination of a single improved LLR table will be discussed by exemplary making reference to SLC memory cells having the exemplary and simplified threshold voltage distributions illustrated in FIG. 4A; in this figure, the left and right threshold voltage distributions are associated with the symbols (or bit patterns) "1" and "0", respectively, and the hard and soft read reference voltages are denoted by $V_1$ and $V_{1A}$, $V_{1F}$, respectively (consistently with the notation used in FIGS. 2B and 2C).

In order to determine the improved LLR table, the following operations a), b) and c) are preferably performed:

a) a sample symbol among the possible symbols (e.g., "0" or "1" in the exemplary considered example of SLC memory cells, "00", "01", "11" or "10" in case of MLC memory cells, and the like) are stored in sample memory cells, i.e. the sample memory cells are programmed with the threshold voltage corresponding to the respective sample symbol. Just as an example, the sample memory cells may for example comprise the memory cells that, among the plurality of memory cells 210 of the SSD device 300, are in critical positions in the memory array 205 or assumed to be the most significant or representative samples among the plurality of memory cells 210;

b) a plurality of read operations of the sample symbol stored in the sample memory cells (hereinafter referred to as sample read operations) are carried out. Each sample read operation comprises reading the sample symbol with the hard $V_1$ and soft $V_A$,$V_F$ read reference voltages (i.e., hard and soft read operations) thereby obtaining respective read sample symbols, namely a read sample symbol resulting from the sample read operation carried out at the hard reference voltage $V_1$, and two read sample symbols resulting from the sample read operations carried out at the soft $V_A$,$V_F$ reference voltages. If the number of sample read operations is sufficiently high, then the following $2^3=8$ combinations of read sample symbols are obtained (with the number of occurrence of each read sample symbol combination that, as known, contributes to define the LLR value for that read bit symbol combination):

| $V_1$ | $V_{1F}$ | $V_{1A}$ |
|---|---|---|
| 0 | 0 | 0 |
| 0 | 0 | 1 |
| 0 | 1 | 0 |
| 0 | 1 | 1 |
| 1 | 0 | 0 |
| 1 | 0 | 1 |
| 1 | 1 | 0 |
| 1 | 1 | 1 |

As should be readily understood, the read sample symbols resulting from the sample read operations carried out at the hard $V_1$ and soft $V_A$, $V_F$ reference voltages also reflect the symbols that may result from read operations (at the hard $V_1$ and soft $V_A$,$V_F$ reference voltages) carried out when the SSD device 300 is operated in normal mode (i.e. not in the characterization phase, e.g. when write and read operations are carried out by the end user on the SSD device 300).

c) for each read sample symbol combination, associating with the read sample symbol combination an error information when, the corresponding sample symbols of that combination are associated with respective threshold voltages that, based on the threshold voltage distributions, are inconsistent with each other, or the corresponding LLR value otherwise. An example of improved LLR table is shown below (wherein the error information is indicated by the letter "e", and the LLR values are merely indicative):

| $V_1$ | $V_{1F}$ | $V_{1A}$ | LLR value |
|---|---|---|---|
| 0 | 0 | 0 | +15 |
| 0 | 0 | 1 | e |
| 0 | 1 | 0 | +5 |
| 0 | 1 | 1 | e |
| 1 | 0 | 0 | e |
| 1 | 0 | 1 | e |
| 1 | 1 | 0 | −2 |
| 1 | 1 | 1 | −15 |

Preferably, an inconsistency among the read sample symbols of a same read sample symbol combination is determined when, based on the threshold voltage distributions, the read sample symbols identify (on the threshold voltage distributions) respective intervals of possible threshold voltages whose coexistence cannot take place (e.g., in that no common interval of threshold voltages can be identified among the intervals of possible threshold voltages). As will be better understood from the following example, for the purposes of the present disclosure, the interval of possible threshold voltages of a read sample symbol comprises the possible threshold voltages to which the actual threshold voltages of the sample memory cells belong, where said actual threshold voltages are the threshold voltages at which the sample memory cells storing the sample symbol are actually programmed; otherwise stated, read sample symbols of each symbol combination identify, based on the respective associated threshold voltage distributions and on the respective reference voltages, respective intervals of possible threshold voltages, among the respective actual threshold voltages, that may be exhibited by the memory cells.

Examples of determination of inconsistency among the read sample symbols are shown below for each read sample symbol combination. In the following examples, each interval of possible threshold voltages corresponds to one or more regions among the regions A, B, C, D into which the hard $V_1$ and soft $V_A$, $V_F$ read reference voltages ideally split the threshold voltage distributions (as illustrated in FIG. 4A), the notations "$V_1$= . . . ", "$V_{1A}$= . . . ", and "$V_{1F}$= . . . " denote the read sample symbols at, respectively, the hard $V_1$ and soft $V_{1A}$, $V_{1F}$ reference voltages (and, hence, as a whole, the y denote the read sample symbol combination), the notation "→region . . . " associated with a read sample symbol denotes the region(s), on the threshold voltage distributions, corresponding to the interval(s) of possible threshold voltages associated that read sample symbol, the notation "}→region . . . " associated with each read sample symbol combination denotes the intersection region resulting from the intersection of the three regions identified by the read sample symbols of that read sample symbol combination, and the notation "}→e . . . " denotes the error information due to absence of an intersection region:

$$\left.\begin{array}{c}V_1 = 0 \to \text{region } A \text{ OR region } B \\ V_{1F} = 0 \to \text{region } A \\ V_{1A} = 0 \to \text{region } A \text{ OR region } B \text{ OR region } C\end{array}\right\} \to \text{region } A$$

$$\left.\begin{array}{c}V_1 = 0 \to \text{region } A \text{ OR region } B \\ V_{1F} = 0 \to \text{region } A \\ V_{1A} = 1 \to \text{region } D\end{array}\right\} \to e$$

$$\left.\begin{array}{c}V_1 = 0 \to \text{region } A \text{ OR region } B \\ V_{1F} = 1 \to \text{region } B \text{ OR region } C \text{ OR region } D \\ V_{1A} = 0 \to \text{region } A \text{ OR region } B \text{ OR region } C\end{array}\right\} \to \text{region } B$$

$$\left.\begin{array}{c}V_1 = 0 \to \text{region } A \text{ OR region } B \\ V_{1F} = 1 \to \text{region } B \text{ OR region } C \text{ OR region } D \\ V_{1A} = 1 \to \text{region } D\end{array}\right\} \to e$$

$$\left.\begin{array}{c}V_1 = 1 \to \text{region } C \text{ OR region } D \\ V_{1F} = 0 \to \text{region } A \\ V_{1A} = 0 \to \text{region } A \text{ OR region } B \text{ OR region } C\end{array}\right\} \to e$$

$$\left.\begin{array}{c}V_1 = 1 \to \text{region } C \text{ OR region } D \\ V_{1F} = 0 \to \text{region } A \\ V_{1A} = 1 \to \text{region } D\end{array}\right\} \to e$$

$$\left.\begin{array}{c}V_1 = 1 \to \text{region } C \text{ OR region } D \\ V_{1F} = 1 \to \text{region } B \text{ OR region } C \text{ OR region } D \\ V_{1A} = 0 \to \text{region } A \text{ OR region } B \text{ OR region } C\end{array}\right\} \to \text{region } C$$

$$\left.\begin{array}{c}V_1 = 1 \to \text{region } C \text{ OR region } D \\ V_{1F} = 1 \to \text{region } B \text{ OR region } C \text{ OR region } D \\ V_{1A} = 1 \to \text{region } D\end{array}\right\} \to \text{region } D$$

Considering, for instance, the read symbol combination 001 (i.e., $V_1$=0, $V_{1F}$=0 and $V_{1A}$=1), the meaning of the above example is the following:

- the read sample symbol at the hard reference voltage $V_1$ is 0, therefore the actual threshold voltages of the sample memory cells belong to the possible threshold voltages located in regions A or B of the threshold voltage distribution $D_2$ (it meaning that the sample memory cells are programmed at actual threshold voltages higher than the hard reference voltage $V_1$);
- the read sample symbol at the soft reference voltage $V_{1F}$ is 0, therefore the actual threshold voltages of the sample memory cells belong to the possible threshold voltages located in region A of the threshold voltage distribution $D_2$ (it meaning that the sample memory cells are programmed at actual threshold voltages higher than the soft reference voltage $V_{1F}$);
- the read sample symbol at the soft reference voltage $V_{1A}$ is 1, therefore the actual threshold voltages of the sample memory cells belong to the possible threshold voltages located in region D of the threshold voltage distribution $D_1$ (it meaning that the sample memory cells are programmed at actual threshold voltages lower than the soft reference voltage $V_{1A}$);
- as no intersection region among regions A or B, region A, and region D can be found, an inconsistency among the read sample symbols of the read sample symbol combination 001 is determined (see the symbol "?" in the table of FIG. 4A), and the error information is associated with that read sample symbol combination. Otherwise stated, since the intervals of possible threshold voltages identified by the read sample symbols at the hard $V_1$ and soft $V_{1A}$, $V_{1F}$ reference voltages do not overlap at least partly to each other, the error information is associated with that read sample symbol combination.

Considering, for instance, the read symbol combination 010 (i.e., $V_1$=0, $V_{1F}$=1 and $V_{1A}$=0), the meaning of the above example is the following:

- the read sample symbol at the hard reference voltage $V_1$ is 0, therefore the actual threshold voltages of the sample memory cells belong to the possible threshold voltages located in regions A or B of the threshold voltage distribution $D_2$ (it meaning that the sample memory cells are programmed at actual threshold voltages higher than the hard reference voltage $V_1$);
- the read sample symbol at the soft reference voltage $V_{1F}$ is 1, therefore the actual threshold voltages of the sample memory cells belong to the possible threshold voltages located in regions B or C or D of the threshold voltage distribution $D_1$ (it meaning that the sample memory cells are programmed at actual threshold voltages lower than the soft reference voltage $V_{1F}$);
- the read sample symbol at the soft reference voltage $V_{1A}$ is 0, therefore the actual threshold voltages of the sample memory cells belong to the possible threshold voltages located in regions A or B or C of the threshold voltage distribution $D_2$ (it meaning that the sample memory cells are programmed at actual threshold voltages higher than the soft reference voltage $V_{1A}$);

an intersection region exists among regions A or B, regions B or C or D and regions A or B or C, the intersection region being in this case region B (it meaning that the sample memory cells are programmed at actual threshold voltages higher than the hard reference voltage $V_1$ and lower than the soft reference voltage $V_{1F}$) the LLR value for the read sample symbol combination 010 is determined as usual, and no error information is associated with that read sample symbol combination. Otherwise stated, since the intervals of possible threshold voltages identified by the read sample symbols at the hard $V_1$ and soft $V_{1A}$, $V_{1F}$ reference voltages overlap at least partly to each other (thereby defining a common region or intersection region), the LLR value for the read sample symbol combination 010 is determined as usual, and no error information is associated with that read sample symbol combination.

As should be readily understood, in case of MLC and TLC memory cells the above operations a), b) and c) are reiterated for each one of the hard reference voltages (i.e., respectively, $V_1,V_2,V_3$ and $V_1,V_2,V_3,V_4,V_5,V_6,V_7$) and the associated soft read reference voltages (i.e., respectively, $V_{1A}$-$V_{1F}$,$V_{2A}$-$V_{2F}$,$V_{3A}$-$V_{3F}$ and $V_{1A}$-$V_{1F}$,$V_{2A}$-$V_{2F}$,$V_{3A}$-$V_{3F}$,$V_{4A}$-$V_{4F}$,$V_{5A}$-$V_{5F}$,$V_{6A}$-$V_{6F}$,$V_{7A}$-$V_{7F}$), thereby obtaining a corresponding plurality of LLR tables.

Back to the activity diagram, the decoding procedure 400 takes place when the SSD device 300 is operated in normal mode, i.e. when write and read operations are carried out by the end user on the SSD device 300 (and, hence, on the respective memory cells).

The decoding procedure 400 comprises, after a read operation (action node 405) of symbols stored in the memory cells (the read operation including the hard and soft read operations), each combination of hard and soft bits so obtained is compared to the symbol combinations stored in the corresponding improved LLR tables.

If at least one combination of the hard and soft bits exists that identify a symbol combination (hereinafter referred to as error symbol combination) to which, according to the corresponding improved LLR table, the error information is associated (exit branch Y of decision node 410), then an arbitrary symbol value is set for the error symbol combination (action node 415), and hard decoding (action node 420) of the read symbols is performed (for all the read symbols with the exception of the error symbol combination, whose symbol values have instead be set or forced to the arbitrary symbol value).

Placing the symbols of the error symbol combinations at the same arbitrary symbol value (for example, "0" or "1") advantageously doubles, or substantially doubles, the error correction of the hard decoding; in fact, in a typical scenario, a plurality of error symbol combinations are expected, statistically, to give rise to substantially even amount of symbol values "0" and symbol values "1". This makes error correction capabilities of the hard decoding very likely sufficient to correctly decode the read symbols without performing soft decoding (which instead involves longer and complex computation capabilities which negatively affect latency of the SSD device 300).

Back to the decoding procedure 400, in case of failure of the hard decoding (exit branch N of decision node 425), another arbitrary symbol value is set for the error symbol combinations (action node 430), and hard decoding (action node 435) of the read symbols is performed (for all the read symbols with the exception of the error symbol combination, whose symbol values have instead be set or forced to the arbitrary symbol value). The arbitrary symbol value set at action node 430 is conveniently different from the arbitrary symbol value set at action node 415. Assuming that the arbitrary symbol value set at action node 415 is "0" or "1", the arbitrary symbol value set at action node 430 is "1" or "0", respectively.

As discussed above, placing the read symbols of the error symbol combinations at the same arbitrary symbol value (for example, "0" or "1") theoretically doubles the error correction of the hard decoding, if, as statistically expected, substantially even amount of symbols "0" and symbols "1" are provided. In case of "unbalance" between the amount of symbols "0" and symbols "1", the following scenarios may occur: in case of higher amount of symbols "0", the hard decoding carried out at action node 420 is expected to be successful, otherwise the hard decoding carried out at action node 435 is expected to be successful.

However, according to an embodiment of the present invention, in case of failure of the hard decoding carried out at action node 435 (exit branch N of decision node 440), soft decoding of the read symbols is performed (action node 450).

Advantageously, in order to perform soft decoding, the LLR value associated with each error symbol combination is preferably set at an arbitrary LLR value (action node 445). In the example at issue in which soft decoding based on LDPC code is performed, the arbitrary LLR value associated with each error symbol combination is conveniently "0". By placing the LLR values associated with the error symbol combinations at "0", i.e. the value that is indicative of maximum uncertainty, soft decoding is made more effective (in that, in soft decoding based on LDPC, priority is given to read symbols associated with the lowest LLR values, in absolute value).

After soft decoding, the decoding procedure 400 ends (action node 460), either negatively (in which case the read memory cells are advantageously marked as failed) or positively.

Back to decision node 410, if no combination of hard and soft bits exists that identifies an error symbol combination (exit branch N of decision node 410), the decoding procedure 400 advantageously goes on according to conventional decoding steps (for example, according to conventional soft decoding)—action node 455.

Back to decision nodes 425 and 440, in case of success of the hard decoding (exit branches Y of decision nodes 425 and 440), the decoding procedure 400 ends (action node 460), thus without performing any soft decoding.

Naturally, in order to satisfy local and specific requirements, a person skilled in the art may apply to the present invention as described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

Although in the foregoing explicit reference has been made to LDPC codes, the principles of the present invention equivalently apply to any ECC code making use of soft bits and associated LLR values.

What is claimed is:

1. A solid state storage device comprising:
a plurality of memory cells each one programmable to store a bit pattern selected from a plurality of bit patterns, each bit pattern being associated with a corresponding nominal threshold voltage of the memory cells, wherein memory cells programmed to store the bit pattern selected from said plurality of bit patterns exhibit actual threshold voltages that are variable over the memory cells around the corresponding nominal threshold voltage thereby defining a respective threshold voltage distribution associated with the bit pattern, and wherein pairs of adjacent bit patterns, which are associated with corresponding adjacent nominal threshold voltages, can be discriminated, during a read operation, by respective first reference voltages between the corresponding adjacent nominal threshold voltages,
a controller for storing a plurality of LLR tables each one associated with a respective one of said first reference voltages, wherein each LLR table contains:
a plurality of bit pattern combinations, each bit pattern combination comprising a first bit pattern, selected from said plurality of bit patterns, that may result from a read operation of the memory cells with the respective first reference voltage, a second bit pattern, selected from said plurality of bit patterns, that may result from a read operation of the memory cells with a second reference voltage higher than the first reference voltage, and a third bit pattern, selected from said plurality of bit patterns, that may result from a read operation of the memory cells with a third reference voltage lower than the first reference voltage, wherein the first, second and third bit patterns of each bit pattern combination identify, based on the respective associated threshold voltage distributions and on the respective first, second and third reference voltages, respective intervals of possible threshold voltages, among the respective actual threshold voltages, that may be exhibited by the memory cells, and
for each bit pattern combination:
an error information when the intervals of possible threshold voltages identified by the first, second and third bit patterns of said each bit pattern combination do not overlap, or
a LLR value indicative of an outcome bit pattern and of an indication of reliability of the outcome bit pattern when the intervals of possible threshold voltages identified by the first, second and third bit patterns of said each bit pattern combination overlap.

2. The solid state storage device of claim 1, wherein the first reference voltages are hard reference voltages, and wherein the second and third reference voltages are soft reference voltages associated with the hard reference voltages.

3. The solid state storage device of claim 1, wherein the LLR value ranges between first and second LLR values higher and lower than a third LLR value, respectively, the third LLR value being indicative of complete uncertainty of the outcome bit pattern, and wherein the error information comprises said third LLR value.

4. The solid state storage device of claim 3, wherein said third LLR value is 0.

5. The solid state storage device of claim 1, wherein the LLR tables of said plurality of LLR tables are determined during a characterization phase of the solid state storage device, and wherein the controller is configured to, after a read operation of memory cells providing a plurality of read bit pattern combinations including at least one read bit pattern combination corresponding to a bit pattern combination that, in the respective LLR table, has the error information:
set the at least one read bit pattern combination at an arbitrary outcome bit pattern, and
hard decode the plurality of the read bit pattern combinations based on the at least one read bit pattern combination set at the arbitrary outcome bit pattern.

6. The solid state storage device of claim 5, wherein in case of failure of said hard decoding, the controller is configured to:
set the at least one read bit pattern combination at a further arbitrary outcome bit pattern different from said arbitrary outcome bit pattern, and
further hard decode the plurality of the read bit pattern combinations based on the at least one read bit pattern combination set at the further arbitrary outcome bit pattern.

7. The solid state storage device of claim 6, wherein in case of failure of said further hard decoding, the controller is configured to:
set the at least one read bit pattern combination with an arbitrary LLR value, and
soft decode the plurality of the read bit pattern combinations based on the LLR values and on the arbitrary LLR value set for the at least one read bit pattern combination.

8. The solid state storage device of claim 7, wherein the LLR value ranges between first and second LLR values higher and lower than a third LLR value, respectively, the third LLR value being indicative of complete uncertainty of the outcome bit pattern, and wherein the arbitrary LLR value comprises said third LLR value.

9. The solid state storage device of claim 7, wherein said soft decoding is based on a "Low Density Parity Check" (LDPC) code.

10. The solid state storage device of claim 1, wherein the memory cells are flash memory cells.

11. The solid state storage device of claim 1, wherein said memory cells are NAND flash memory cells.

12. A controller for a solid state storage device, wherein the solid state storage device comprises a plurality of memory cells each one programmable to store a bit pattern selected from a plurality of bit patterns, each bit pattern being associated with a corresponding nominal threshold voltage of the memory cells, wherein memory cells programmed to store the bit pattern selected from said plurality of bit patterns exhibit actual threshold voltages that are variable over the memory cells around the corresponding nominal threshold voltage thereby defining a respective threshold voltage distribution associated with the bit pattern, and wherein pairs of adjacent bit patterns, which are associated with corresponding adjacent nominal threshold voltages, can be discriminated, during a read operation, by respective first reference voltages between the corresponding adjacent nominal threshold voltages,
wherein the controller stores a plurality of LLR tables each one associated with a respective one of said first reference voltages, wherein each LLR table contains:

a plurality of bit pattern combinations, each bit pattern combination comprising a first bit pattern, selected from said plurality of bit patterns, that may result from a read operation of the memory cells with the respective first reference voltage, a second bit pattern, selected from said plurality of bit patterns, that may result from a read operation of the memory cells with a second reference voltage higher than the first reference voltage, and a third bit pattern, selected from said plurality of bit patterns, that may result from a read operation of the memory cells with a third reference voltage lower than the first reference voltage, wherein the first, second and third bit patterns of each bit pattern combination identify, based on the respective associated threshold voltage distributions and on the respective first, second and third reference voltages, respective intervals of possible threshold voltages, among the respective actual threshold voltages, that may be exhibited by the memory cells, and for each bit pattern combination:
an error information when the intervals of possible threshold voltages identified by the first, second and third bit patterns of said each bit pattern combination do not overlap, or
a LLR value indicative of an outcome bit pattern and of an indication of reliability of the outcome bit pattern when the intervals of possible threshold voltages identified by the first, second and third bit patterns of said each bit pattern combination overlap.

13. The controller of claim 12, wherein the first reference voltages are hard reference voltages, and wherein the second and third reference voltages are soft reference voltages associated with the hard reference voltages.

14. The controller of claim 12, wherein the LLR value ranges between first and second LLR values higher and lower than a third LLR value, respectively, the third LLR value being indicative of complete uncertainty of the outcome bit pattern, and wherein the error information comprises said third LLR value.

15. The controller of claim 14, wherein said third LLR value is 0.

16. The controller of claim 12, wherein the LLR tables of said plurality of LLR tables are determined during a characterization phase of the solid state storage device, and wherein the controller is configured to, after a read operation of memory cells providing a plurality of read bit pattern combinations including at least one read bit pattern combination corresponding to a bit pattern combination that, in the respective LLR table, has the error information:
set the at least one read bit pattern combination at an arbitrary outcome bit pattern, and
hard decode the plurality of the read bit pattern combinations based on the at least one read bit pattern combination set at the arbitrary outcome bit pattern.

17. The controller of claim 16, wherein in case of failure of said hard decoding, the controller is configured to:
set the at least one read bit pattern combination at a further arbitrary outcome bit pattern different from said arbitrary outcome bit pattern, and
further hard decode the plurality of the read bit pattern combinations based on the at least one read bit pattern combination set at the further arbitrary outcome bit pattern.

18. The controller of claim 17, wherein in case of failure of said further hard decoding, the controller is configured to:

set the at least one read bit pattern combination with an arbitrary LLR value, and
soft decode the plurality of the read bit pattern combinations based on the LLR values and on the arbitrary LLR value set for the at least one read bit pattern combination.

19. The controller of claim 18, wherein the LLR value ranges between first and second LLR values higher and lower than a third LLR value, respectively, the third LLR value being indicative of complete uncertainty of the outcome bit pattern, and wherein the arbitrary LLR value comprises said third LLR value.

20. The controller of claim 18, wherein said soft decoding is based on a "Low Density Parity Check" (LDPC) code.

21. A method comprising:
performing a characterization of a solid state storage device, wherein the solid state storage device comprises a plurality of memory cells each one programmable to store a bit pattern selected from a plurality of bit patterns, each bit pattern being associated with a corresponding nominal threshold voltage of the memory cells, wherein memory cells programmed to store the bit pattern selected from said plurality of bit patterns exhibit actual threshold voltages that are variable over the memory cells around the corresponding nominal threshold voltage thereby defining a respective threshold voltage distribution associated with that same bit pattern, and wherein pairs of adjacent bit patterns, which are associated with corresponding adjacent nominal threshold voltages, can be discriminated, during a read operation, by respective first reference voltages between the corresponding adjacent nominal threshold voltages,
the method comprising, during said characterization, storing in a controller of the solid state storage device a plurality of LLR tables, each one associated with a respective one of said first reference voltages, wherein each LLR table contains:
a plurality of bit pattern combinations, each bit pattern combination comprising a first bit pattern, selected from said plurality of bit patterns, that may result from a read operation of the memory cells with the respective first reference voltage, a second bit pattern, selected from said plurality of bit patterns, that may result from a read operation of the memory cells with a second reference voltage higher than the first reference voltage, and a third bit pattern, selected from said plurality of bit patterns, that may result from a read operation of the memory cells with a third reference voltage lower than the first reference voltage, wherein the first, second and third bit patterns of each bit pattern combination identify, based on the respective associated threshold voltage distributions and on the respective first, second and third reference voltages, respective intervals of possible threshold voltages, among the respective actual threshold voltages, that may be exhibited by the memory cells, and for each bit pattern combination:
an error information when the intervals of possible threshold voltages identified by the first, second and third bit patterns of said each bit pattern combination do not overlap, or
a LLR value indicative of an outcome bit pattern and of an indication of reliability of the outcome bit pattern when the intervals of possible threshold voltages identified by the first, second and third bit patterns of said each bit pattern combination overlap.

22. The method of claim 21, wherein the first reference voltages are hard reference voltages, and wherein the second and third reference voltages are soft reference voltages associated with the hard reference voltages.

23. The method of claim 21, wherein the LLR value ranges between first and second LLR values higher and lower than a third LLR value, respectively, the third LLR value being indicative of complete uncertainty of the outcome bit pattern, and wherein the error information comprises said third LLR value.

24. The method of claim 23, wherein said third LLR value is 0.

25. The method of claim 21, wherein after the characterization of the solid state storage device the method further comprises, after a read operation of memory cells providing a plurality of read bit pattern combinations including at least one read bit pattern combination corresponding to a bit pattern combination that, in the respective LLR table, has the error information:
setting the at least one read bit pattern combination at an arbitrary outcome bit pattern, and
hard decoding the plurality of the read bit pattern combinations based on the at least one read bit pattern combination set at the arbitrary outcome bit pattern.

26. The method of claim 25, further comprising, in case of failure of said hard decoding:
setting the at least one read bit pattern combination at a further arbitrary outcome bit pattern different from said arbitrary outcome bit pattern, and
further hard decoding the plurality of the read bit pattern combinations based on the at least one read bit pattern combination set at the further arbitrary outcome bit pattern.

27. The method of claim 26, further comprising, in case of failure of said further hard decoding:
setting the at least one read bit pattern combination with an arbitrary LLR value, and
soft decoding the plurality of the read bit pattern combinations based on the LLR values and on the arbitrary LLR value set for the at least one read bit pattern combination.

28. The method of claim 27, wherein the LLR value ranges between first and second LLR values higher and lower than a third LLR value, respectively, the third LLR value being indicative of complete uncertainty of the outcome bit pattern, and wherein the arbitrary LLR value comprises said third LLR value.

29. The method of claim 27, wherein said soft decoding is based on a "Low Density Parity Check" (LDPC) code.

* * * * *